(12) United States Patent
Kawashima et al.

(10) Patent No.: US 7,586,130 B2
(45) Date of Patent: Sep. 8, 2009

(54) VERTICAL FIELD EFFECT TRANSISTOR USING LINEAR STRUCTURE AS A CHANNEL REGION AND METHOD FOR FABRICATING THE SAME

(75) Inventors: Takahiro Kawashima, Osaka (JP); Tohru Saitoh, Ibaraki (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/344,574

(22) Filed: Feb. 1, 2006

(65) Prior Publication Data
US 2006/0125025 A1 Jun. 15, 2006

Related U.S. Application Data

(63) Continuation of application No. PCT/JP2005/017830, filed on Sep. 28, 2005.

(30) Foreign Application Priority Data
Oct. 4, 2004 (JP) .............................. 2004-291170

(51) Int. Cl.
  *H01L 29/732* (2006.01)
(52) U.S. Cl. .................. 257/135; 977/938; 257/401; 257/288; 257/368; 257/242; 257/263; 257/302; 257/328; 257/329; 257/E27.02; 257/E27.022; 257/E27.031; 257/E27.038; 257/E27.039; 257/E27.041; 257/E27.042; 257/E27.054; 257/E27.055; 257/E27.056; 257/E27.057; 257/E27.058; 257/E27.096; 257/E29.118; 257/E29.131; 257/E29.183; 257/E29.186; 257/E29.189; 257/E29.198; 257/E29.257; 257/E29.262; 257/E29.274; 257/E29.313; 257/E29.318; 257/E21.375; 257/E21.41; 257/E21.447; 257/E21.612; 257/E21.676

(58) Field of Classification Search ................. 977/762; 257/135; 438/135, 138
See application file for complete search history.

(56) References Cited

U.S. PATENT DOCUMENTS
4,862,240 A * 8/1989 Watanabe et al. ........... 257/370
(Continued)

FOREIGN PATENT DOCUMENTS
EP 0 452 950 10/1991
(Continued)

OTHER PUBLICATIONS

K. Rim et al., "Fabrication and Mobility Characteristics of Ultra-thin Strained Si Directly on Insulator (SSDOI) MOSFETs" IEEE, 2003.
(Continued)

*Primary Examiner*—Minh-Loan T Tran
*Assistant Examiner*—Fei Fei Yeung Lopez
(74) *Attorney, Agent, or Firm*—McDermott Will & Emery LLP

(57) ABSTRACT

A vertical field effect transistor includes: an active region with a bundle of linear structures functioning as a channel region; a lower electrode, functioning as one of source and drain regions; an upper electrode, functioning as the other of the source and drain regions; a gate electrode for controlling the electric conductivity of at least a portion of the bundle of linear structures included in the active region; and a gate insulating film arranged between the active region and the gate electrode to electrically isolate the gate electrode from the bundle of linear structures. The transistor further includes a dielectric portion between the upper and lower electrodes. The upper electrode is located over the lower electrode with the dielectric portion interposed and includes an overhanging portion sticking out laterally from over the dielectric portion. The active region is located right under the overhanging portion of the upper electrode.

27 Claims, 16 Drawing Sheets

U.S. PATENT DOCUMENTS

| | | | |
|---|---|---|---|
| 5,106,778 A * | 4/1992 | Hollis et al. | 438/173 |
| 6,740,910 B2 | 5/2004 | Roesner et al. | |
| 2001/0007783 A1* | 7/2001 | Lee et al. | 438/154 |
| 2002/0114949 A1 | 8/2002 | Bower et al. | |
| 2002/0163079 A1 | 11/2002 | Awano | |
| 2003/0094637 A1 | 5/2003 | Awano | |
| 2004/0005258 A1 | 1/2004 | Fonash et al. | |
| 2006/0105513 A1* | 5/2006 | Afzali-Ardakani et al. | 438/197 |
| 2006/0128088 A1* | 6/2006 | Graham et al. | 438/202 |
| 2006/0273389 A1* | 12/2006 | Cohen et al. | 257/331 |

FOREIGN PATENT DOCUMENTS

| | | |
|---|---|---|
| EP | 0452950 A2 * | 10/1991 |
| JP | 2003-158093 | 5/2003 |
| JP | 2003-226509 | 8/2003 |
| JP | 2004-165297 | 6/2004 |
| JP | 2005-159332 | 6/2005 |
| WO | WO 02/17362 A2 | 2/2002 |
| WO | WO 2004/038767 | 5/2004 |

OTHER PUBLICATIONS

J.G. Fossum et al., "Physical Insights on Design and Modeling of Nanoscale FinFETs" IEEE, 2003.

Y.K. Choi et al., "Reliable Study of CMOS FinFETs" IEEE, IEDM 03-177, 2003.

R. Martel et al., "Single- and multi-wall carbon nanotube field-effect transistors", Applied Physics Letters vol. 73, No. 17, Oct. 26, 1998, pp. 2447-2449.

D. Wang et al., "Germanium nanowire field-effect transistors with $SiO_2$ and high-$k$ $HfO_2$ gate dielectrics", Applied Physics Letters vol. 83, No. 12, Sep. 22, 2003, pp. 2432-2434.

J.Chen et al., "Vertical nanowire transistors with low leakage current", Applied Physics Letters vol. 85, No. 8, Aug. 23, 2004, pp. 1401-1403.

H.T. Ng et al., "Single Crystal Nanowire Vertical Surround-Gate Field-Effect Transistor", Nano Letters, 2004, vol. 4, No. 7, pp. 1247-1252.

International Preliminary Report on Patentability and Written Opinion issued in International Application No. PCT/JP2005/017830, dated Sep. 28, 2005.

* cited by examiner

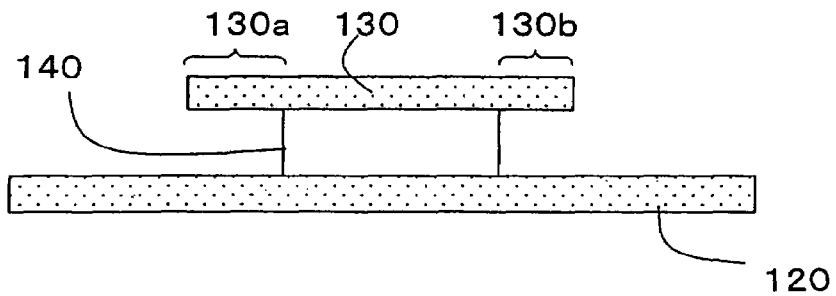
*FIG.2A*
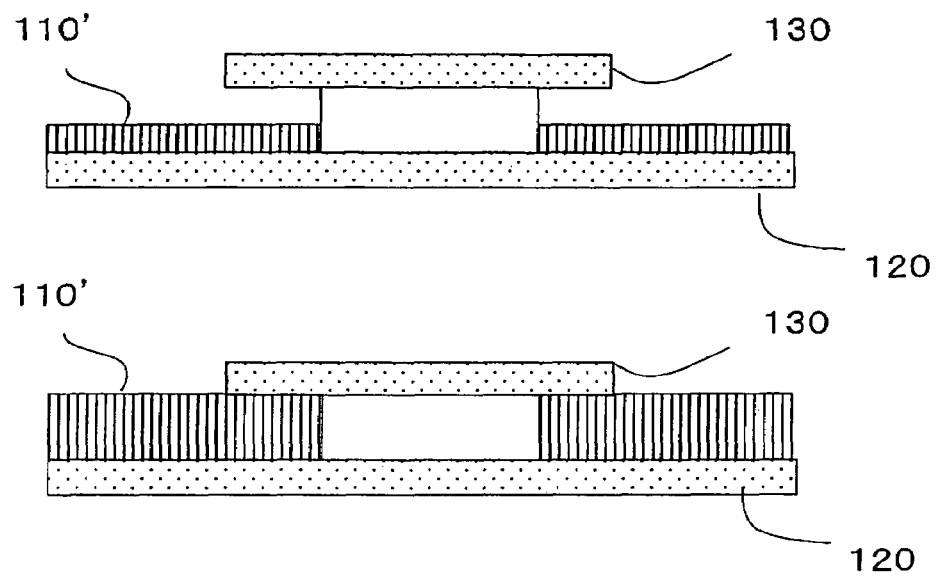
*FIG.2B*
*FIG.2C*
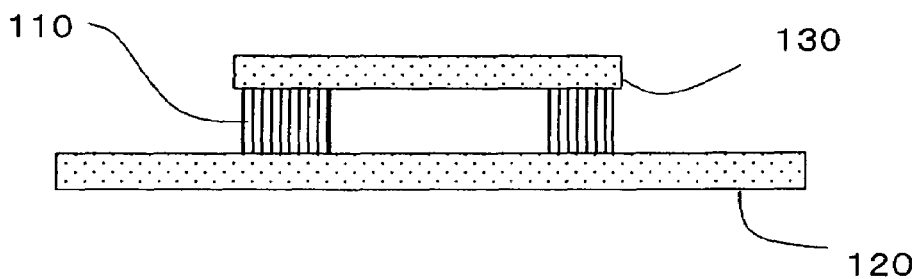
*FIG.2D*

VERTICAL FIELD EFFECT TRANSISTOR USING LINEAR STRUCTURE AS A CHANNEL REGION AND METHOD FOR FABRICATING THE SAME

RELATED APPLICATIONS

This Application is a continuation of International Application No. PCT/JP2005/017830, whose international filing date is Sep. 28, 2005, which in turn claims the benefit of Japanese Application No. 2004-291170, filed Oct. 4, 2004, the disclosures of which Applications are incorporated by reference herein.

BACKGROUND OF THE INVENTION

1. Field of the Invention

The present invention relates to a vertical field effect transistor having an active region, which is made of a bundle of linear structures such as nanowires or carbon nanotubes that function as a channel region. The present invention also relates to a method for fabricating a vertical field effect transistor, which can provide nanowires on a region to be an active region such that the nanowires and the channel region are self-aligned with each other.

2. Description of the Related Art

Transistors used in large-scale integrated circuits (LSIs) and thin-film transistors (TFTs) used in flat panel displays are all classified as field effect transistors (FETs) according to their operating principles. And the performance of those transistors has been enhanced by reducing their dimensions. For example, in a silicon semiconductor process, a fine-line patterning process with a design rule of 0.1 µm or less is already realized by shortening the wavelength of an exposing radiation source for use in a photolithographic process.

However, such a size reduction realized by modifying photolithographic process parameters is going to reach a limit. In addition, the smaller the minimum patterning size, the higher the prices of exposure systems and photomasks tend to be.

In view of these considerations, more and more people have attempted to improve the performance of FETs recently by adopting either a totally new material such as strained silicon or germanium (see K. Rim, et al., "Fabrication and Mobility Characteristics of Ultra-thin Strained Si Directly on Insulator (SSDOI) MOSFETs", IEEE IEDM 2003, p. 49, for example) or a novel structure such as Fin FET (see Y. K. Choi, et al., "Reliability Study of CMOS Fin FET," IEEE IEDM 2003, p. 177). Among other things, technologies of fabricating a transistor using linear structures such as carbon nanotubes (CNTs) or semiconductor nanowires have attracted much attention in the art. The CNTs and nanowires have a columnar structure with a diameter of just several nanometers and could realize transistors on a nanometer scale. R. Martel, et al. reported a room temperature operation of a transistor using CNTs at a normal temperature in "Single- and Multi-Wall Carbon Nanotube Field-Effect Transistors," Appl. Phys. Lett. 73, p. 2447, 1998. Also, D. Wang, et al. disclosed a room temperature operation of a transistor using nanowires in "Germanium Nanowire Field-Effect Transistors with $SiO_2$ and High-K $HfO_2$ Gate Dielectrics," Appl. Phys. Lett. 83, p. 2432, 2003. In the transistors disclosed by Martel et al. and Wang et al., however, their channel length is defined by the photolithographic technique adopted. Accordingly, methods for forming nanometer scale FETs by a self-organizing technique, not by the photolithographic process, have been researched.

A transistor, formed by growing the CNTs or nanowires vertically, is disclosed in U.S. Pat. No. 6,740,910 B2. This is a vertical field effect transistor, in which a CNT is grown in each of a plurality of through holes that are provided through an insulating film and used as a channel region.

It is known that the conductivity of a CNT changes depending how to wind a graphene sheet. In the current CNT growing method, nanotubes with different degrees of conductivity are formed at random. Thus, it is difficult to selectively form nanotubes with a desired degree of conductivity.

As for nanowires on the other hand, a desired degree of conductivity is achieved by selecting an appropriate material. Also, nanowires can be doped with a dopant either by a conventional ion implantation process or by an in-situ doping process to be carried out while the nanowires are growing.

In this manner, the conductivity and doping level are easily controllable by using nanowires. Thus, by introducing the nanowires into a device and by establishing a self-organizing process, a high-performance device could be fabricated at a reduced cost in the near future without complicating the manufacturing process excessively.

According to the conventional techniques disclosed in the documents mentioned above, however, it is difficult to control the direction and positions of nanowires growing.

As for CNTs, there is a report that the growth direction thereof is controllable by utilizing an electric field or a magnetic field. Nevertheless, that method provides a narrow control range, requires a complicated manufacturing process and therefore, cannot be used effectively to make LSIs or TFTs. Regarding the positional control of nanowires, manipulation using STM or AFM and a catalyst position control by a photolithographic technique have been reported. In the positional control process by manipulation, however, each device unit needs to be shifted. Accordingly, this technique cannot be applied effectively to mass-producing large-scale circuits or circuits including multiple types of elements. According to the positional control by the photolithographic technique on the other hand, it is difficult to reduce the dimensions below the exposure limit. For that reason, this technique is not suitable to forming a nanometer scale device.

Also, it is very difficult to grow nanowires like a blanket and then selectively remove unnecessary ones of the nanowires. This is because if a resist pattern were provided on a layer including bundles of nanowires, then the resist material would enter the gaps between the nanowires easily.

Furthermore, in the manufacturing process disclosed in U.S. Pat. No. 6,740,910, the shape and position of each channel region are defined by the shape and position of its associated through hole in the insulating film. Accordingly, to make a very small channel region, an equally small through hole needs to be provided through the insulating film. Thus, the dimensions of a transistor cannot be reduced below the limit of the photolithographic process.

SUMMARY OF THE INVENTION

In order to overcome the problems described above, preferred embodiments of the present invention provide a vertical field effect transistor, which contributes to significantly increasing the number of devices integrated together per unit area, and also provide a method for fabricating such a field effect transistor.

A vertical field effect transistor according to a preferred embodiment of the present invention preferably includes: an active region, which includes a bundle of multiple linear structures functioning as a channel region where electric carriers are transported; a lower electrode, which is connected to the bottom of the active region and which functions as one of source and drain regions; an upper electrode, which is connected to the top of the active region and which functions as the other of the source and drain regions; a gate electrode for controlling the electric conductivity of at least a portion of the bundle of linear structures included in the active region; and a gate insulating film, which is arranged between the active region and the gate electrode in order to electrically isolate the gate electrode from the bundle of linear structures. The transistor preferably further includes a dielectric portion between the upper and lower electrodes. The upper electrode is located over the lower electrode with the dielectric portion interposed between the upper and lower electrodes, and includes an overhanging portion that sticks out laterally from over the dielectric portion. The active region is located right under the overhanging portion of the upper electrode.

In one preferred embodiment of the present invention, each said linear structure in the bundle is made of a columnar semiconductor that has grown on the lower electrode.

In this particular preferred embodiment, the columnar semiconductor has a single crystal structure.

In another preferred embodiment, the outer side surface of the active region is aligned with the side surface of the upper electrode.

In still another preferred embodiment, the dielectric portion is made of an electrical insulator that supports the upper electrode, and the lower surface of the upper electrode is in contact with either the dielectric portion or the active region.

In yet another preferred embodiment, the columnar semiconductor includes at least one element selected from the group consisting of silicon, germanium and carbon.

In yet another preferred embodiment, the columnar semiconductor includes a dopant that defines its conductivity type.

In yet another preferred embodiment, the vertical field effect transistor further includes a semiconductor substrate or an SOI substrate to support the lower electrode thereon.

An electronic device according to a preferred embodiment of the present invention preferably includes a substrate and a plurality of field effect transistors provided on the substrate. At least one of the field effect transistors is a vertical field effect transistor including: an active region, which includes a bundle of multiple linear structures functioning as a channel region where electric carriers are transported; a lower electrode, which is connected to the bottom of the active region and which functions as one of source and drain regions; an upper electrode, which is connected to the top of the active region and which functions as the other of the source and drain regions; a gate electrode for controlling the electric conductivity of at least a portion of the bundle of linear structures included in the active region; and a gate insulating film, which is arranged between the active region and the gate electrode in order to electrically isolate the gate electrode from the bundle of linear structures. The transistor further includes a dielectric portion between the upper and lower electrodes. The upper electrode is located over the lower electrode with the dielectric portion interposed between the upper and lower electrodes, and includes an overhanging portion that sticks out laterally from over the dielectric portion. The active region is located right under the overhanging portion of the upper electrode.

In one preferred embodiment of the present invention, the field effect transistors together make up a CMOS circuit.

In another preferred embodiment, the electronic device functions as a large scale integrated circuit.

In still another preferred embodiment, the substrate is a glass substrate or a plastic substrate.

In yet another preferred embodiment, the field effect transistors are arranged in matrix on the substrate such that each said field effect transistor is associated with a pixel, and the electronic device functions as a display device.

A method for fabricating a vertical field effect transistor according to a preferred embodiment of the present invention is a method for fabricating a transistor including: an active region, which includes a bundle of multiple linear structures functioning as a channel region where electric carriers are transported; a lower electrode, which is connected to the bottom of the active region and which functions as one of source and drain regions; an upper electrode, which is connected to the top of the active region and which functions as the other of the source and drain regions; a gate electrode for controlling the electric conductivity of at least a portion of the bundle of linear structures included in the active region; and a gate insulating film, which is arranged between the active region and the gate electrode in order to electrically isolate the gate electrode from the bundle of linear structures. The method includes the steps of: (A) forming a structure in which a dielectric portion is interposed between the upper electrode and the lower electrode and in which the upper electrode has an overhanging portion that sticks out laterally from over the dielectric portion; and (B) growing a bundle of linear structures so that the linear structures extend from an area on the upper surface of the lower electrode, which is not covered with the dielectric portion, toward the lower surface of the overhanging portion of the upper electrode.

In one preferred embodiment of the present invention, the step (A) includes the steps of: (a1) forming a structure in which the dielectric portion is interposed between the upper and lower electrodes; and (a2) side etching and setting back at least a part of the dielectric portion inward from its side surface.

In this particular preferred embodiment, the step (a2) includes the step of etching away the part of the dielectric portion by a wet etching process.

In another preferred embodiment, the step (a1) includes the steps of: providing a first conductor film to be the lower electrode; depositing an insulating film on the first conductor film; stacking a second conductor film to be the upper electrode on the insulating film; providing a masking layer, which defines the location and shape of the upper electrode, on the second conductor film; etching away exposed portions of the second conductor film, which are not covered with the masking layer, thereby forming the upper electrode out of the second conductor film; selectively etching the insulating film so as to form the dielectric portion; and patterning the first conductor film, thereby forming the lower electrode out of the first conductor film.

In still another preferred embodiment, the step (a1) includes the steps of: providing a first conductor film to be the lower electrode; depositing an insulating film on the first conductor film; stacking a second conductor film to be the upper electrode on the insulating film; providing a masking layer, which defines the location and shape of the upper electrode, on the second conductor film; etching away exposed portions of the second conductor film, which are not covered with the masking layer, thereby forming the upper electrode out of the second conductor film; and selectively etching the insulating film with the upper electrode used as a mask, thereby defining the dielectric portion.

In a specific preferred embodiment, the step of depositing the insulating film includes the step of depositing a silicon dioxide film or a silicon nitride film.

In still another preferred embodiment, the method further includes the step (C) of selectively removing some of the linear structures, which are not covered with the upper electrode, by etching the linear structures anisotropically with the upper electrode used as a mask.

In yet another preferred embodiment, the step (B) includes the step of growing the linear structures by a CVD process.

In this particular preferred embodiment, the step (A) includes the step of putting a catalyst for growing the linear structures on the first conductor film deposited.

Alternatively or additionally, the step (A) includes the step of putting a catalyst for growing the linear structures on the insulating film deposited.

According to various preferred embodiments of the present invention described above, an active region, made of a bundle of linear structures such as nanowires or CNTs, is provided so as to be self-aligned with an upper electrode. Thus, the linear structures can be selectively arranged at any desired locations and a vertical field effect transistor, of which the channel length is defined by a non-photolithographic technique, can be provided.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 2A through 2D are cross-sectional views illustrating respective process steps for fabricating the vertical field effect transistor shown in FIG. 1.

DETAILED DESCRIPTION OF PREFERRED EMBODIMENTS

First, the basic configuration of a vertical field effect transistor according to a preferred embodiment of the present invention will be described with reference to FIG. 1.

Figure 1:
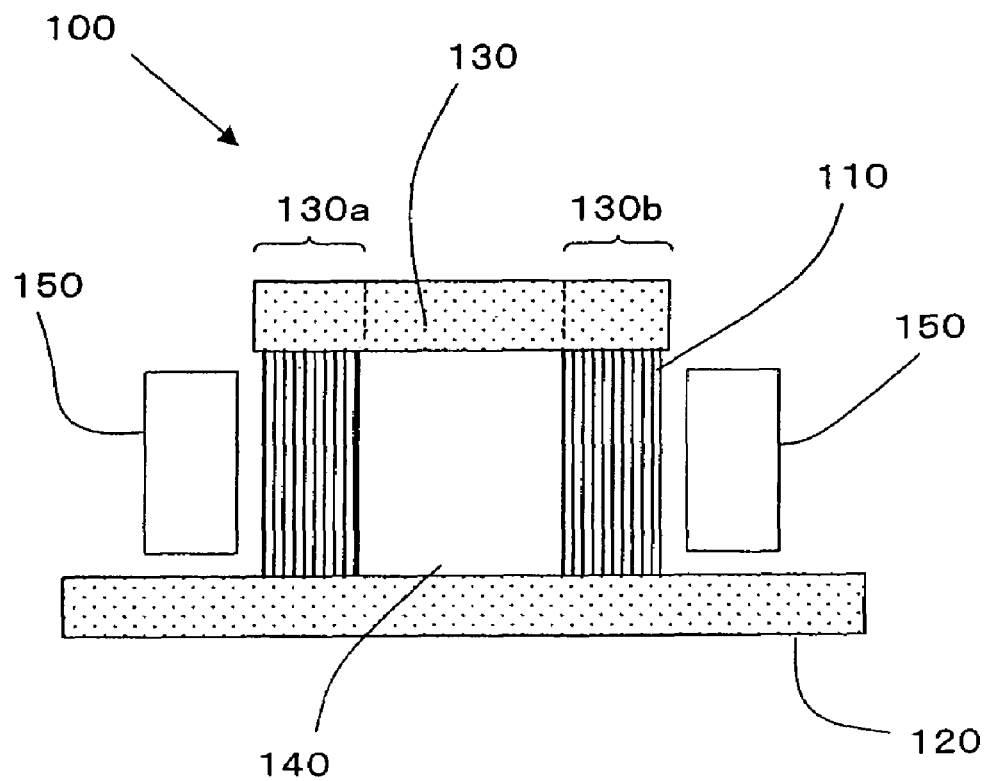
FIG. 1 is a cross-sectional view schematically illustrating an exemplary configuration for a vertical field effect transistor according to a preferred embodiment of the present invention.

The vertical field effect transistor 100 shown in FIG. 1 includes an active region 110, which is made of a bundle of linear structures where electric carriers (i.e., electrons or holes) should be transported. There are gaps between the linear structures that form the active region 110. Those gaps may be filled with a dielectric material such as a resin. The bundle of linear structures included in the active region 110 functions as a channel region as a whole. The linear structures are preferably nanowires or CNTs with a diameter of a nanometer scale.

The active region 110 vertically connects together a pair of electrodes functioning as source/drain regions (i.e., a lower electrode 120 and an upper electrode 130). The upper electrode 130, functioning as one of the source/drain regions, is located over the lower electrode 120 with a dielectric portion 140 interposed between them, and includes an overhanging portion 130a, 130b that sticks out laterally from over the dielectric portion 140. A gate electrode 150 is opposed to the side surface of the active region 110 with a gate insulating film (not shown) interposed between them. The gate electrode 150 is connected to a driver circuit by way of a gate line (not shown). By getting the electric potential at the gate electrode 150 increased or decreased by the driver circuit, the electric conductivity of the active region 110 can be controlled and the expected transistor operation (i.e., switching or amplification) is realized.

The vertical field effect transistor according to this preferred embodiment of the present invention is mainly characterized in that the active region 110 made of the bundle of linear structures is located right under the overhanging portion 130a, 130b of the upper electrode 130 supported on the dielectric portion 140. Each of these linear structures is preferably a columnar semiconductor that has grown on the lower electrode 120. And the outer side surface of the active region 110 is aligned with the side surface of the upper electrode 130.

In a method for fabricating such a vertical field effect transistor according to a preferred embodiment of the present invention, the outer side surface of the active region 110 is defined so as to be self-aligned with the side surface of the upper electrode 130.

Hereinafter, it will be described with reference to FIGS. 2A through 2D how such a self-aligned active region 110 may be made of a bundle of nanowires.

First, as shown in FIG. 2A, a structure in which the upper electrode 130 is supported over the lower electrode 120 by the dielectric portion 140 is formed. In the state shown in FIG. 2A, the upper electrode 130 already has the overhanging portion 130a, 130b that sticks out laterally from over the upper surface of the dielectric portion 140. The dielectric portion 140 is preferably a portion of a patterned insulating film. The dielectric portion 140 may define a cylindrical, rectangular or any other isolated pattern. Alternatively, the dielectric portion 140 may also be an elongated line extending along the surface of the substrate. As used herein, the "isolated pattern" refers to one of a plurality of separate portions that are provided for respective transistors.

The structure shown in FIG. 2A may be formed by any of various methods, a preferred one of which will be described in detail later.

Next, as shown in FIG. 2B, nanowires 110' are grown on the lower electrode 120. Specific method and conditions of growing the nanowires 110' will be described later. The nanowires 110' are grown until the upper edge of the nanowires 110' reaches the lower surface of the upper electrode 130 as shown in FIG. 2C. In the example shown in FIGS. 2B and 2C, the nanowires 110' grow selectively on the lower electrode 120.

Thereafter, as shown in FIG. 2D, the exposed nanowires 110', which are not covered with the upper electrode 130, are etched away, thereby defining an active region 110 by the bundle of remaining nanowires 110'. This etching process is carried out using the upper electrode 130 as an etching mask. For that reason, the upper electrode 130 is preferably made of a material that is not easily etched by the etchant for the nanowires 110'. For example, if the upper electrode 130 is made of platinum, the etchant for the nanowires 110' is preferably HBR or chlorine gas. Likewise, to prevent the lower electrode 120, which is located under the nanowires 110' from being etched unintentionally, the lower electrode 120 is also preferably made of a material that is not easily etched by the etchant for the nanowires 110'. The unnecessary excessive nanowires 110' are preferably removed by an anisotropic etching process. However, even if the etching process advanced partially isotropically, that would not be a serious problem unless the etch depth exceeds a permissible range. If the etching process were not done completely anisotropically, then the outer side surface of the active region 110 would shift slightly inward from the edge of the overhanging portion 130a, 130b of the upper electrode 130. Thus, the "self-aligned" active region 110 may refer to herein such a slightly inwardly shifted active region 110.

According to the method shown in FIGS. 2A through 2D, the shape of the active region 110 may be defined by the respective shapes of the upper electrode 130 and dielectric portion 140 and the arrangement among them. This point will be described with reference to FIGS. 3A through 5B.

Figure 3A:
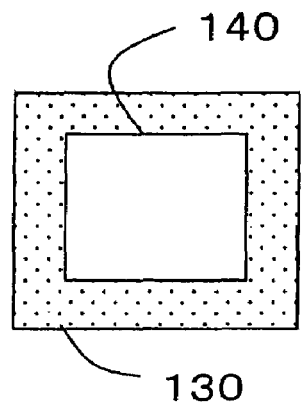
FIG. 3A is a plan view schematically illustrating a positional relationship between the upper electrode 130 and dielectric portion 140 in the process step shown in FIG. 2A.

FIG. 3A is a plan view schematically illustrating a positional relationship between the upper electrode 130 and the dielectric portion 140. It should be noted that in this plan view, the upper electrode 130 and dielectric portion 140 are viewed from under the lower electrode 120 shown in FIG. 1 and that the lower electrode 120 is not illustrated in this plan view for the sake of simplicity. That is to say, a portion of the lower surface of the upper electrode 130, which is in contact with the upper surface of the dielectric portion 140, is not illustrated in FIG. 3A but the other portion of the lower surface of the upper electrode 130, which is not hidden behind the dielectric portion 140 (i.e., the projecting portion), is the overhanging portion of the upper electrode 130.

Figure 3B:
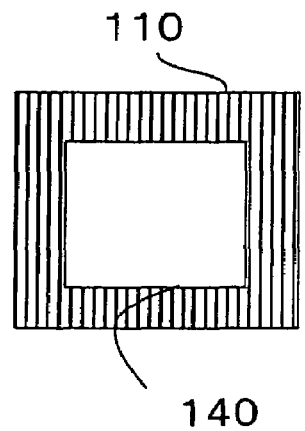
FIG. 3B is a plan view schematically illustrating a positional relationship between the channel region 110 and dielectric portion 140 in the process step shown in FIG. 2D.

If the upper electrode 130 and dielectric portion 140 have the positional relationship shown in FIG. 3A, then the active region 110 will eventually have the planar shape shown in FIG. 3B. That is to say, the active region 110 will be present right under the upper electrode 130 and only where the dielectric portion 140 is not present. The active region 110 is not located outside of the upper electrode 130 because the excessive nanowires for the active region 110 are etched away by using the upper electrode 130 as an etching mask as already described with reference to FIG. 2D.

However, the upper electrode 130 and dielectric portion 140 for use in various preferred embodiments of the present invention are not limited to the ones shown in FIG. 3A. Alternatively, the upper electrode 130 and dielectric portion 140 may also be arranged as shown in FIG. 4A or 5A.

Figure 4A:
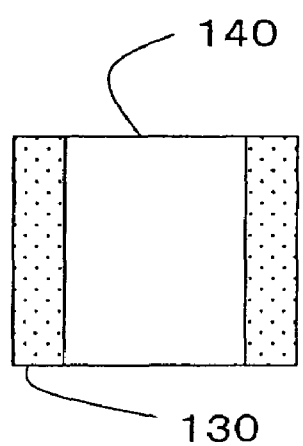
FIG. 4A is a plan view schematically illustrating another positional relationship between the upper electrode 130 and dielectric portion 140 in the process step shown in FIG. 2A.
Figure 4B:
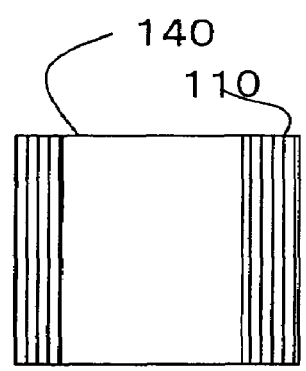
FIG. 4B is a plan view schematically illustrating another positional relationship between the channel region 110 and dielectric portion 140 in the process step shown in FIG. 2D.
Figure 5A:
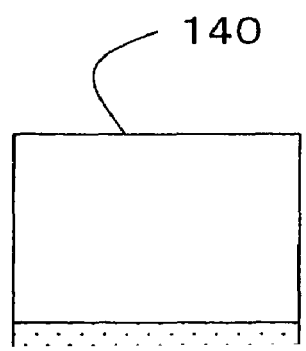
FIG. 5A is a plan view schematically illustrating still another positional relationship between the upper electrode 130 and dielectric portion 140 in the process step shown in FIG. 2A.
Figure 5B:
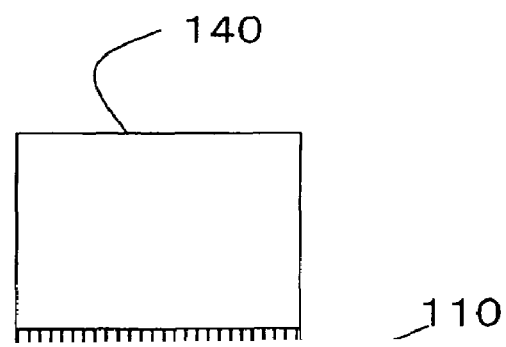
FIG. 5B is a plan view schematically illustrating still another positional relationship between the channel region 110 and dielectric portion 140 in the process step shown in FIG. 2D.

If the arrangement shown in FIG. 4A is adopted, then the active region 110 shown in FIG. 4B is defined. On the other hand, if the arrangement shown in FIG. 5A is adopted, then the active region 110 shown in FIG. 5B is defined. By changing the shapes and arrangement of the upper electrode 130 and dielectric portion 140 in this manner, an active region 110 with any desired planar shape can be formed.

Hereinafter, preferred embodiments of the present invention will be described with reference to the accompanying drawings.

Embodiment 1

Figure 6A:
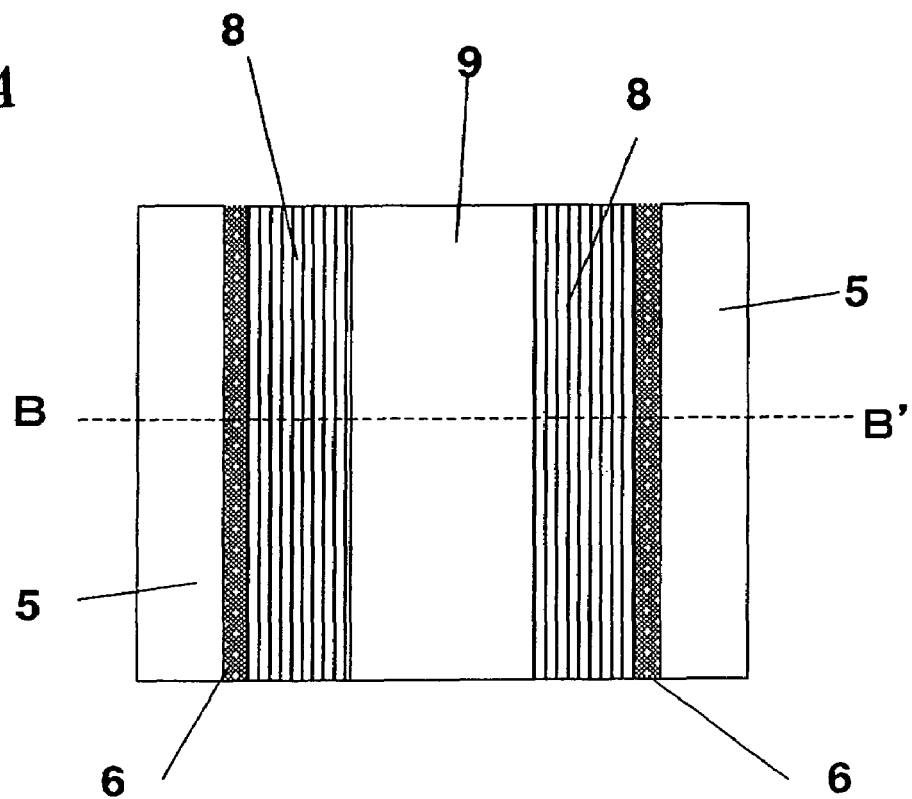
FIG. 6A is a plan view schematically illustrating a vertical thin-film transistor according to a first specific preferred embodiment of the present invention.
Figure 6B:
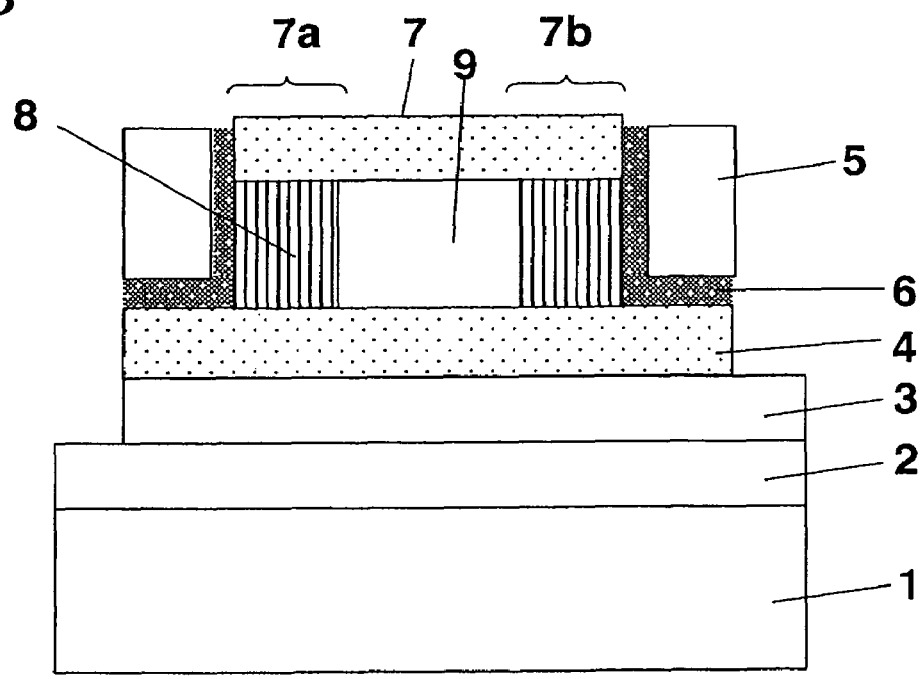
FIG. 6B is a cross-sectional view of the transistor as viewed on the plane VIb-VIb shown in FIG. 6A.

A vertical field effect transistor according to a first specific preferred embodiment of the present invention will be described with reference to FIGS. 6A and 6B. FIG. 6A is a top view schematically illustrating the arrangement of the vertical field effect transistor of this preferred embodiment (in which the illustration of the upper electrode 7 is omitted) and FIG. 6B is a cross-sectional view thereof as viewed on the plane VIb-VIb shown in FIG. 6A.

The transistor of this preferred embodiment is a vertical thin-film transistor (which will be abbreviated herein as a "vertical TFT") provided over a glass substrate 1. In the nanowires of its channel region 8, carriers (electrons or holes) move perpendicularly to the principal surface of the glass substrate 1.

In this preferred embodiment, the channel region 8 is made of a bundle of Ge nanowires doped with a p-type dopant, and vertically connects together a lower electrode 4 functioning as drain region and an upper electrode 7 functioning as source region.

The lower electrode 4 is provided on a silicon dioxide film 2 and a transparent conductive film 3, which are stacked in this order on the glass substrate 1. The transparent conductive film 3 is typically made of ITO. It should be noted that neither the silicon dioxide film 2 nor the transparent conductive film 3 is an essential component for a transistor according to every preferred embodiment of the present invention.

The upper electrode 7 is located over the lower electrode 4 with a dielectric portion 9 interposed between them, and has overhanging portions 7a and 7b that stick out laterally from over the dielectric portion 9. A gate electrode 5 faces the outer side surface of the channel region 8 with a gate insulating film 6 provided between them.

Figure 7:
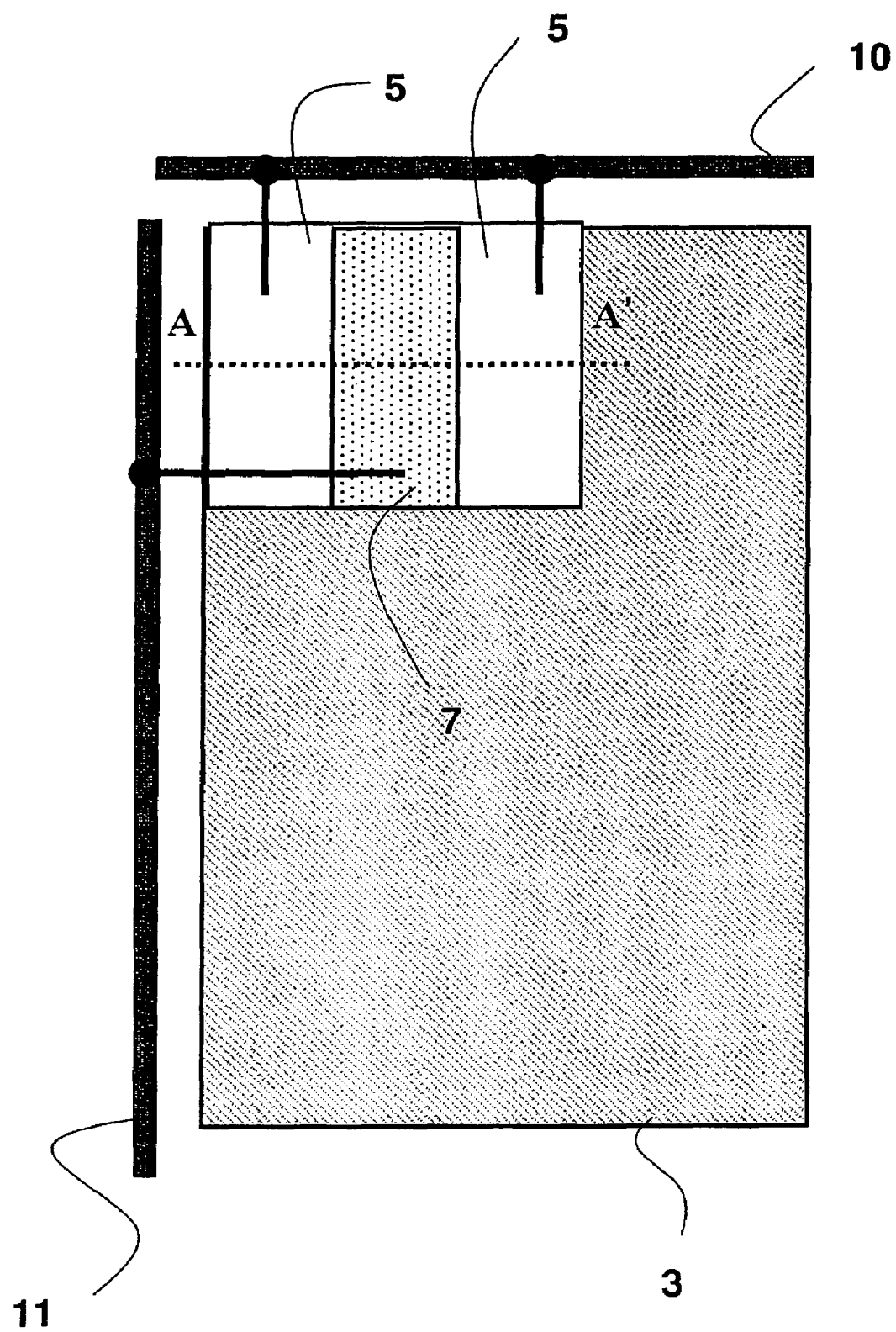
FIG. 7 is a partial plan view of an active-matrix substrate where the vertical thin-film transistor shown in FIG. 6 is used as a switching element for an LCD.

As shown in FIG. 7, the gate electrode 5 and upper electrode 7 of this TFT are connected to a gate line 10 and a data line 11, respectively, and this TFT may be used as a switching element for a flat panel display device, for example. When the TFT of this preferred embodiment is used as a TFT on the active-matrix substrate of a liquid crystal display, the gate line 10 shown in FIG. 7 functions as a gate bus line and the ON/OFF states of the TFT are controlled with a signal supplied from a driver through the gate bus line. On the other hand, the data line 11 functions as a source bus line such that a potential at the transparent conductive film 3 is changed with a signal that has been supplied from a driver through the source bus line. The transparent conductive film 3 defines respective pixels and the transparent conductive film 3 and a counter electrode (not shown) together make up a capacitor. Depending on the quantity of charge stored in that capacitor, a different electric field is created from one pixel to another between the transparent conductive film 3 and counter electrode, thereby controlling the orientation state of liquid crystal molecules. When the orientation state of liquid crystal molecules is controlled on a pixel-by-pixel basis in this manner, the polarization state of light being transmitted through the liquid crystal layer changes, and therefore, a two-dimensional image can be produced by the arrangement of those pixels.

In this example, the TFT of this preferred embodiment is used in a transmissive LCD. Alternatively, this TFT may also be used in a reflective LCD, an organic EL display, an imager or an IC. When this TFT is applied to an imager or an IC, the transparent conductive film 3 shown in FIG. 6B may be omitted.

In this preferred embodiment, the glass substrate 1 is used as a substrate for supporting the TFT thereon. However, the substrate does not have to be a glass substrate but may also be any arbitrary substrate made of an insulator such as silicon dioxide, silicon nitride, aluminum oxide, titanium oxide, acrylic resin, epoxy resin, or polyimide. Not all of the substrate has to be made of an insulator. Thus, the substrate may also be a silicon substrate, an SOI substrate or a compound semiconductor substrate.

Referring back to FIG. 6B, the overhanging portions 7a and 7b of the upper electrode 7, sticking out laterally from over the dielectric portion 9, preferably have a lateral width of at least 10 nm and more preferably have a width falling within the range of about 50 nm to about 100 nm. The height of the dielectric portion 9 defines the height of the channel region 8 as measured perpendicularly to the principal surface of the substrate, and may be set to any arbitrary value according to the required channel length. In this preferred embodiment, the height of the dielectric portion 9 may fall within the range of 50 nm to 1 µm, for example.

The nanowires defining the channel region 8 may be made of any of various semiconductor materials. In this preferred embodiment, the channel region 8 is made of Ge nanowires. The Ge nanowires can be grown effectively from a catalyst metal by a CVD process according to a vapor-liquid-solid (VLS) growth mechanism. In this method, nanowires can be grown so as to have controlled diameters falling within the range of 1 nm to 100 nm.

Examples of preferred catalyst metals that can be used effectively to grow the Ge nanowires include transition metals such as gold, iron, cobalt and nickel and alloys thereof. The catalyst metal may be provided by any arbitrary method. For example, catalyst fine particles, obtained by thermally treating a catalyst metal thin film that has been deposited on the substrate, may be used. In this preferred embodiment, the bundle of nanowires, defining one channel region, may consist of 10 through about 100,000 nanowires.

The lower and upper electrodes 4 and 7 may be made of any of various electrically conductive materials. Since the Ge nanowires are grown on the lower electrode 4, the lower electrode 4 is preferably made of a metal such as gold, silver or platinum, a cobalt silicide or a nickel silicide, for example. If the lower electrode 4 is made of a conductive material that does not function as a catalyst, then fine particles of a catalyst metal are preferably deposited on the surface of the lower electrode 4.

Examples of materials for the gate insulating film 6 that electrically insulates the gate electrode 5 from the channel region 6 include silicon dioxide, silicon nitride, aluminum oxide, germanium oxide, hafnium oxide and other insulators. The gate electrode 5 may be made of an electrically conductive material such as gold, silver, platinum, molybdenum, chromium, or polysilicon.

In this preferred embodiment, a vertical channel region 8 is made of Ge nanowires that are arranged right under the overhanging portions 7a and 7b of the upper electrode 7 so as to be self-aligned with the upper electrode 7. Thus, by controlling the height of the dielectric portion 9 that supports the upper electrode 7 thereon, the channel length of the TFT can be controlled. The dielectric portion 9 is preferably formed by patterning a deposited insulating film. When the dielectric portion 9 is formed by this method, the height of the dielectric portion 9 is defined by the thickness of the insulating film deposited. The thickness of the insulating film to deposit can be controlled with high precision. For that reason, the channel length of the TFT of this preferred embodiment can also be controlled highly precisely. Thus, the channel length of the transistor can be shortened and the number of devices integrated together per unit area can be increased without being limited by the smallest processible size of the photolithographic process. Furthermore, the chip area occupied by a single vertical TFT can be smaller than that of a conventional lateral TFT. Accordingly, if the TFT is used as a switching element for a transmissive LCD, then the aperture ratio can be increased.

MANUFACTURING PROCESS

Hereinafter, a preferred method for fabricating the TFT of this preferred embodiment will be described with reference to FIGS. 8A through 8H.

Figure 8A:
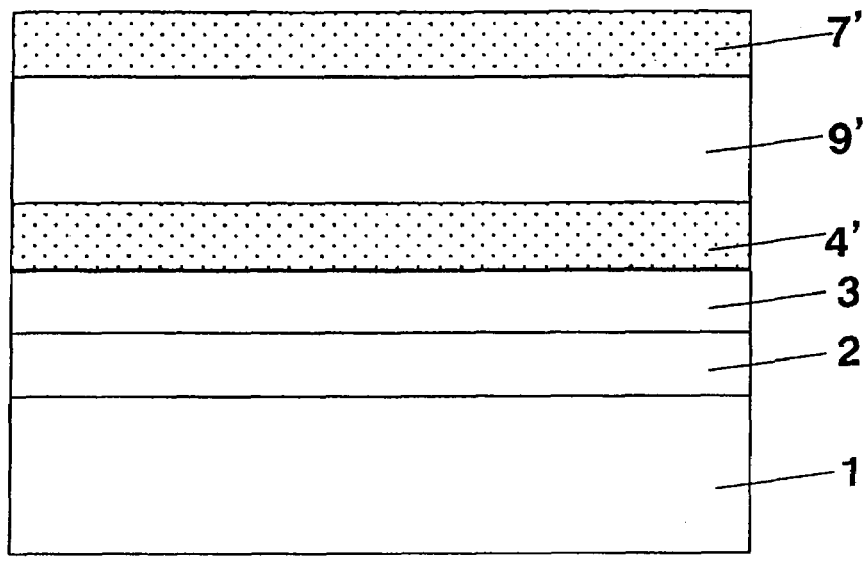
FIGS. 8A through 8H are cross-sectional views illustrating respective process steps for fabricating the vertical thin-film transistor of the first preferred embodiment shown in FIG. 6.

First, as shown in FIG. 8A, a silicon dioxide film 2, an ITO (Indium Tin Oxide) film 3, a first conductor film 4' to be the lower electrode (drain electrode) 4, an insulating film 9' to be the dielectric portion 9, and a second conductor film 7' to be the upper electrode (source electrode) 7 are stacked in this order on the glass substrate 1. The lower and upper electrodes 4 and 7 may be formed by depositing a conductor material such as gold, silver or polysilicon by a sputtering or CVD process, for example. The dielectric portion 9 may be formed by depositing an insulator material such as silicon dioxide or silicon nitride by a sputtering or CVD process, for example.

Figure 8B:
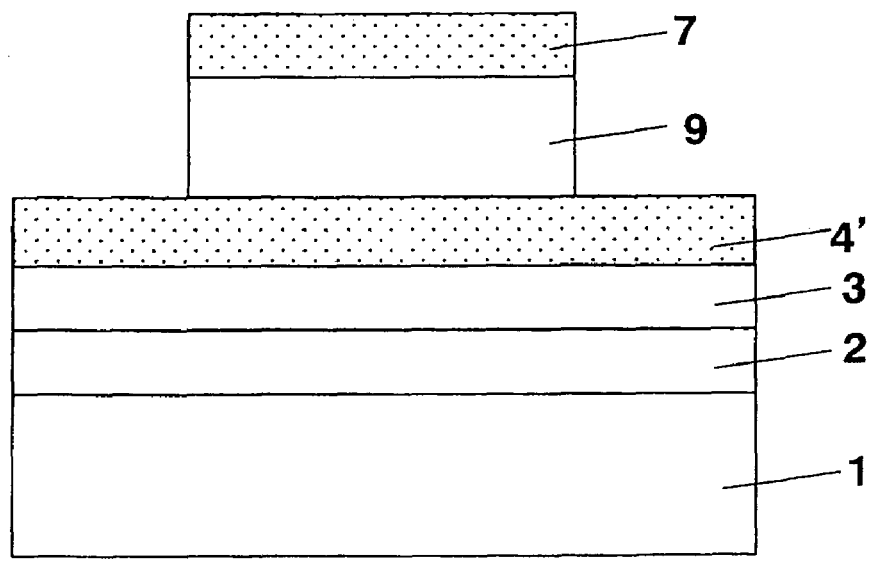

Next, a resist mask (not shown) is defined by a photolithographic process on the second conductor film 7' and then the second conductor film 7' is patterned by an anisotropic etching process, thereby forming the upper electrode (i.e., source electrode) 7 and dielectric portion 9 as shown in FIG. 8B.

Figure 8C:
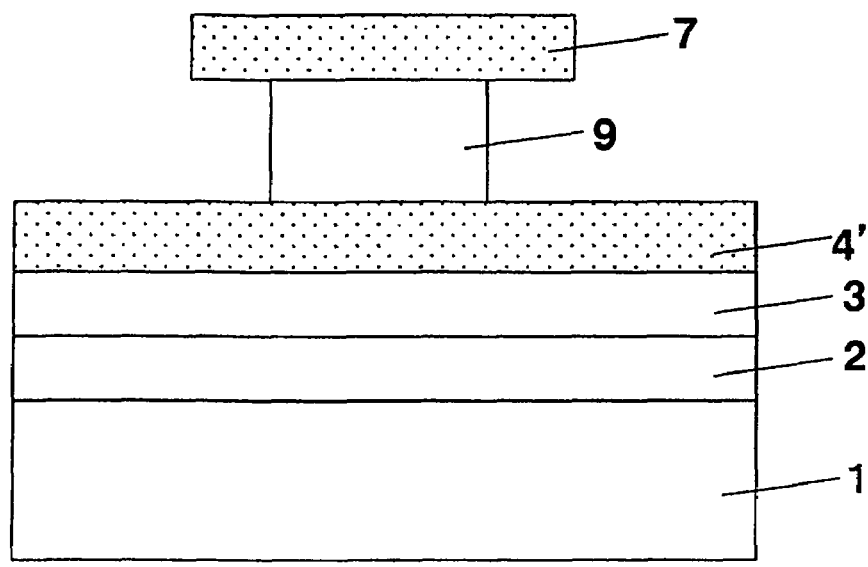

Subsequently, after the resist mask has been removed by an $O_2$ plasma etching process, the dielectric portion 9 is side-etched by a wet etching process, thereby obtaining a structure such as that shown in FIG. 8C. The side etching process of the dielectric portion 9 is preferably carried out so that just the dielectric portion 9 is etched preferentially with the first conductor film 4' to be the lower electrode 4 and the upper electrode 7 hardly etched. The side etching action of the dielectric portion 9 advances isotropically. Accordingly, unless the side surfaces of the dielectric portion 9 are partially masked, the side surfaces of the dielectric portion 9 are etched uniformly to define the structure shown in FIG. 3A, for example. Accordingly, to define the structure shown in FIG. 4A or 5A, the side surfaces of the dielectric portion 9 needs to be masked partially and the side etching process should be started from the other non-masked parts of the dielectric portion 9.

Such a side etching process is preferably carried out as a wet etching process. If the dielectric portion 9 is made of silicon dioxide, hydrofluoric acid solution may be used as the etchant. On the other hand, if the dielectric portion 9 is made of silicon nitride, then pyrophosphoric acid may be used as the etchant. By controlling the etch rate and etch time, the side etch depth (i.e., the lateral depth of the etched portion) can be adjusted. In this preferred embodiment, by adjusting this side etch depth, the size of the overhanging portions 7a and 7b is defined to be at least 10 nm, e.g., so as to fall within the range of about 50 nm to about 100 nm.

Figure 8D:
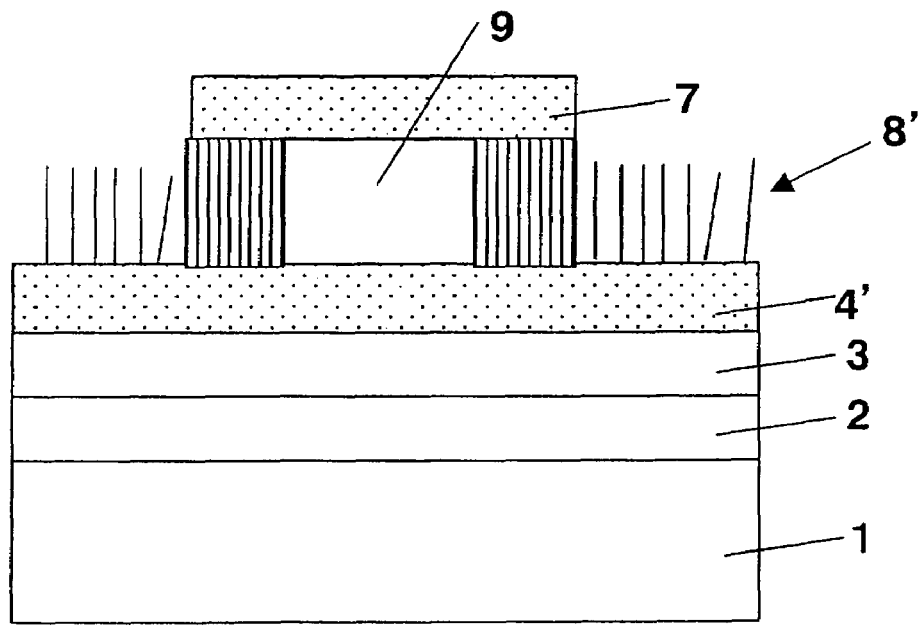

Thereafter, as shown in FIG. 8D, nanowires 8' are grown by a CVD process on the surface of the lower electrode 4. In growing Ge nanowires, a germane gas is used. In growing Si nanowires on the other hand, a silane or disilane gas is preferably used.

If the lower electrode 4 is not made of a catalyst metal, then fine particles of a transition metal such as Ni or Co or an alloy thereof are preferably deposited as a catalyst on the base surface before the nanowires start being grown by a CVD process. Such a catalyst may be deposited either by a method in which metal fine particles are dispersed in a solvent before the nanowires start growing or by a method in which a metal thin film to be the catalyst is thermally treated so as to be aggregated and turn into fine particles.

Figure 8E:
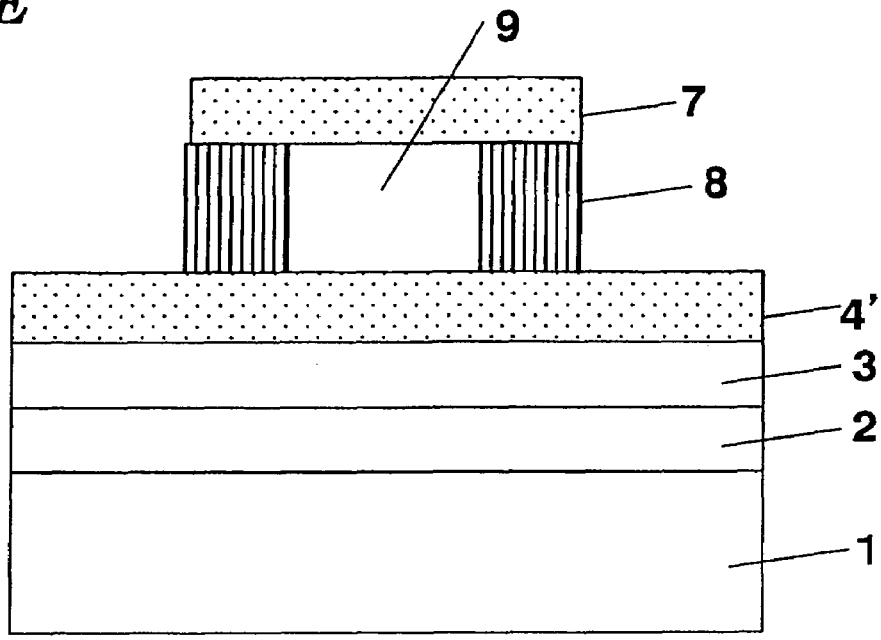

Next, as shown in FIG. 8E, excessive nanowires 8', which are not covered with the upper electrode 7, are selectively removed by an anisotropic etching process. In this process step, the upper electrode 7 is used as an etching mask. Accordingly, the outer side surface of the channel region 8 made of the remaining nanowires 8' is self-aligned with the edge of the upper electrode 7. The lateral size of the channel region 8 is defined by that of the overhanging portions 7a and 7b of the upper electrode 7. Consequently, the channel region 8 can be reduced in size without being limited by the smallest processible size of the photolithographic process.

To selectively remove the excessive nanowires 8' other than those that should work as the channel region 8, the entire surface of the substrate may be subjected to an anisotropic etching process using a chlorine gas first, and then cleaned, for example.

Figure 8F:
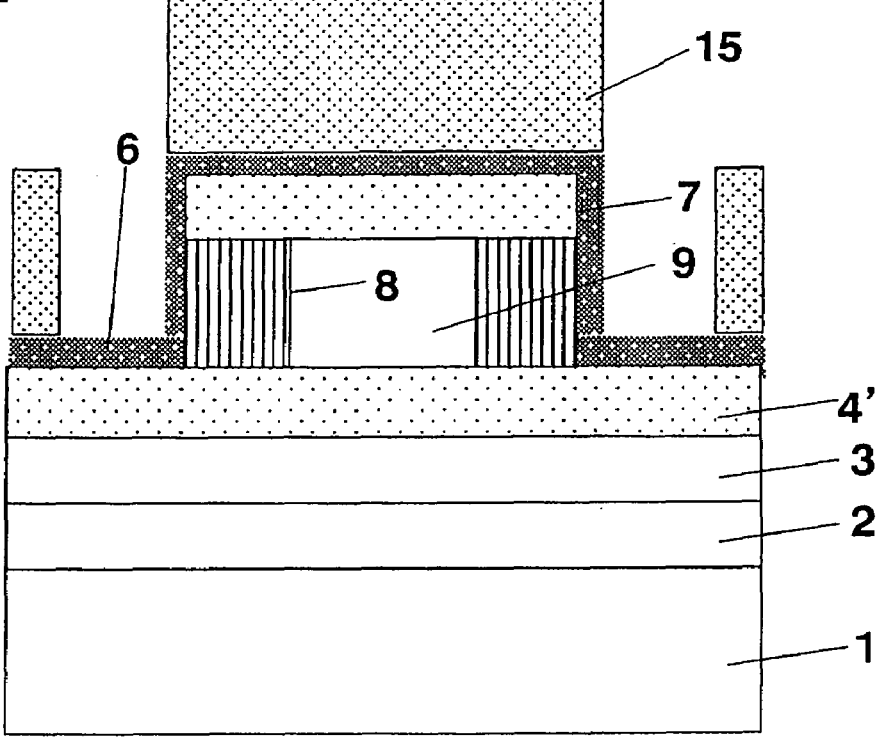
Figure 8G:
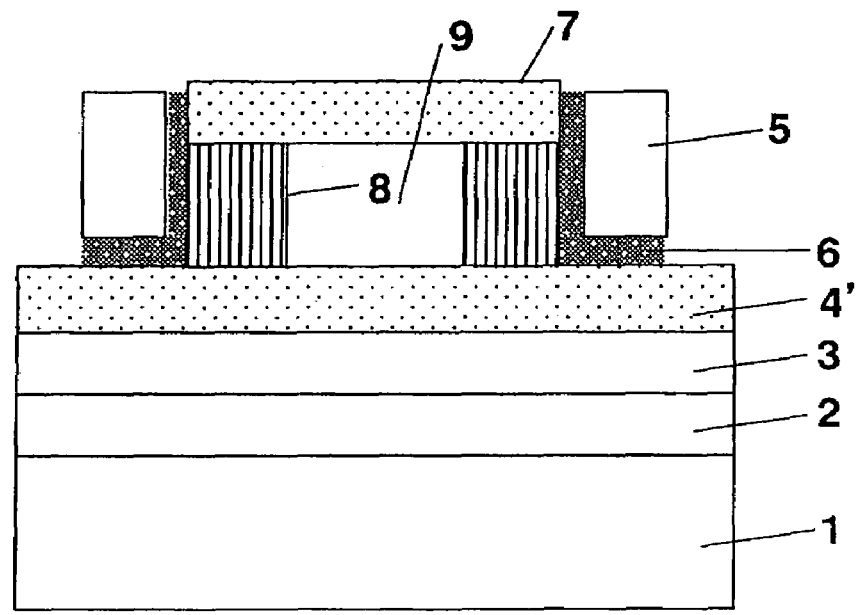

Subsequently, after a gate insulating film 6 has been deposited, a resist pattern 15 is defined as shown in FIG. 8F so as to have openings where the gate electrode will be defined. The gate insulating film 6 may be made of an insulator such as silicon dioxide, silicon nitride or hafnium oxide. Next, when an electrode material to make the gate electrode 5 is deposited on the resist pattern 15, the electrode material filling the openings of the resist pattern 15 is located where the gate electrode 5 will be defined. Thereafter, the resist pattern 15 is removed, thereby lifting off the unnecessary portions of the gate electrode material film and defining the gate electrode 5 as shown in FIG. 8G. Next, the excessive portions of the gate insulating film 6 on the first conductor film 4' and on the upper electrode 7 are removed by a wet etching process.

In this preferred embodiment, the gate electrode 5 is formed by a lift-off technique. Alternatively, the gate electrode 5 may also be formed by depositing the gate electrode material film on the gate insulating film 6 and then subjecting that film to an etch back or polishing process.

Figure 8H:
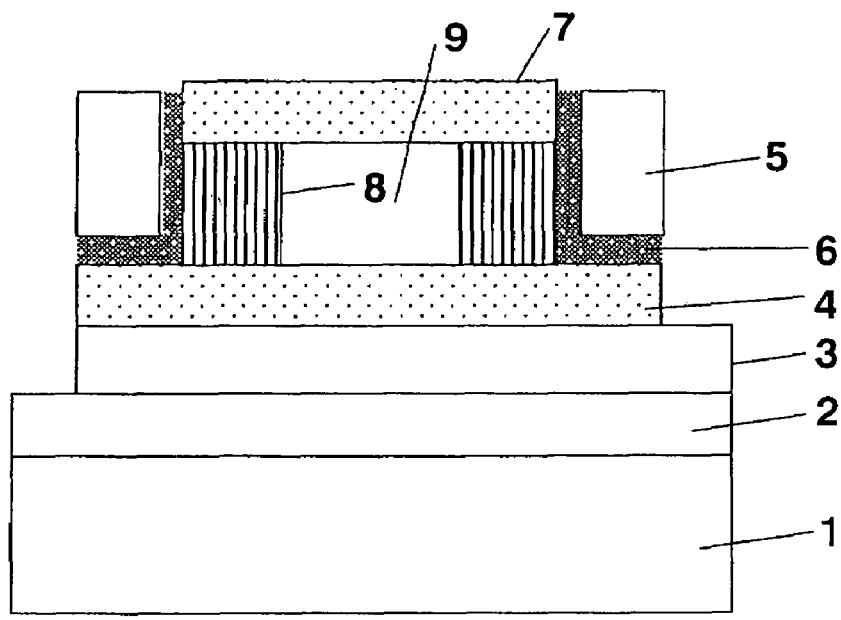

Next, the first conductor film 4' is patterned, thereby defining the lower electrode 4 functioning as a drain electrode as shown in FIG. 8H. Thereafter, the transparent conductive film 3 is patterned by photolithographic and etching processes into the shape of a pixel electrode as shown in FIG. 7, for example. In this preferred embodiment, the first conductor film 4' is patterned by using the upper electrode 7 and gate electrode 5 as an etching mask, and therefore no photomask is needed to define the lower electrode 4. Optionally, however, a photomask for defining the shape of the lower electrode 4 may be prepared and the lower electrode 4 may be patterned so as to have any arbitrary shape.

As described above, in the method of fabricating a vertical TFT according to this preferred embodiment, after the nanowires 8' have been grown, excessive ones of the nanowires 8' can be removed without being subjected to a photolithographic process such that the remaining nanowires 8' are "self-aligned" with the upper electrode 7. Thus, the location and shape of the channel region 8, made of the remaining nanowires 8', can be controlled with high precision. In addition, since there is no need to provide any margin for mask alignment, the TFT can be further miniaturized.

If the second conductor film 7' to be the upper electrode 7 were deposited on the nanowires 8' grown, then the conductive material of the second conductor film 7' would enter the gap between the huge number of nanowires 8'. Consequently, the resultant channel region 8 could not exhibit semiconductor properties. According to this preferred embodiment, however, such a problem is avoidable because the upper electrode 7 has already been formed before the nanowires 8' start growing.

Thus, according to this preferred embodiment, the channel length does not depend on the precision of the photolithographic process, and therefore, a very small channel can be defined with high precision. As a result, the variation in transistor characteristics due to non-uniform channel lengths can be minimized, too.

Figure 9:
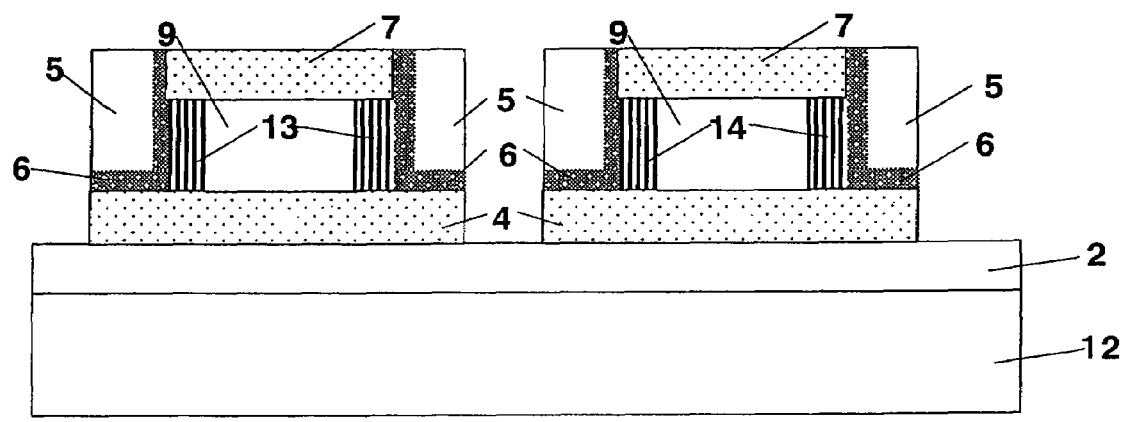
FIG. 9 is a cross-sectional view of a CMOS circuit made up of vertical thin-film transistors according to the first preferred embodiment.

FIG. 9 is a cross-sectional view schematically illustrating a portion of a semiconductor integrated circuit in which a plurality of TFTs according to this preferred embodiment are arranged. Only two transistors are illustrated in FIG. 9. In a preferred embodiment, however, a lot of transistors are preferably integrated together on the same substrate. Also, in the integrated circuit shown in FIG. 9, no transparent conductive film 3 is provided, and the respective transistors are connected together with an interconnection line (not shown). A semiconductor integrated circuit like this is preferably used in a driver circuit for a display device, for example.

The two transistors shown in FIG. 9 preferably have an n-type active region 13, which is made of semiconductor nanowires doped with an n-type dopant, and a p-type active region 14, which is made of semiconductor nanowires doped with a p-type dopant, respectively, and are interconnected together so as to define a CMOS circuit by way of interconnection lines (not shown).

Embodiment 2

Hereinafter, a vertical field effect transistor according to a second specific preferred embodiment of the present invention will be described with reference to FIG. 10 and FIGS. 11A through 11D.

Figure 10:
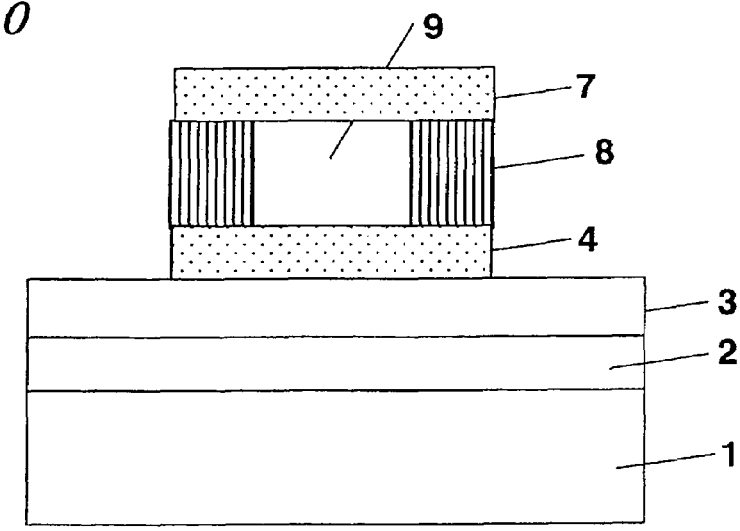
FIG. 10 is a cross-sectional view schematically illustrating a vertical thin-film transistor according to a second specific preferred embodiment of the present invention.

The vertical field effect transistor shown in FIG. 10 basically has the same configuration as the counterpart of the first preferred embodiment described above. Their difference lies in the shape and the patterning method of the lower electrode 4.

Hereinafter, a method for fabricating the vertical field effect transistor of this preferred embodiment will be described with reference to the accompanying drawings.

Figure 11A:
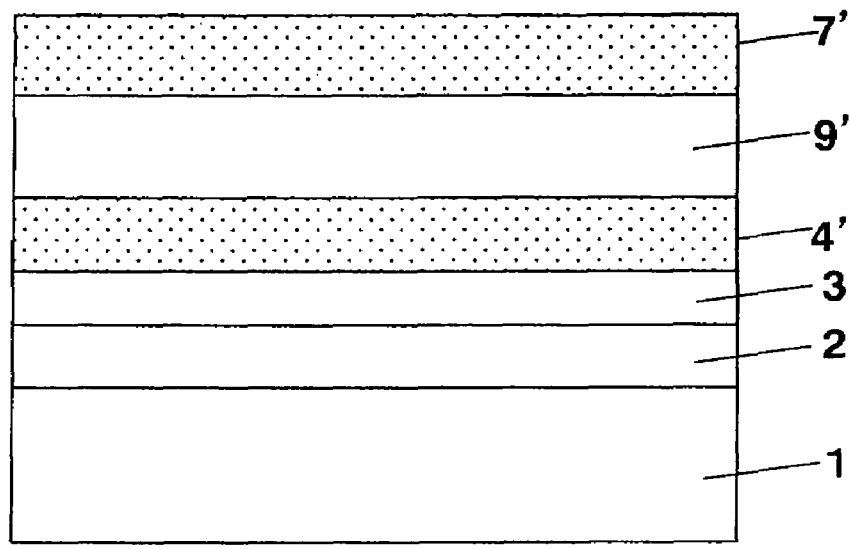
FIGS. 11A through 11D are cross-sectional views illustrating respective process steps for fabricating the vertical thin-film transistor of the second preferred embodiment shown in FIG. 10.

First, as shown in FIG. 11A, a silicon dioxide film 2, a transparent conductive film 3, a first conductor film 4' to be the lower electrode 4, an insulating film 9', and a second conductor film 7' to be the upper electrode 7 are stacked in this order on an insulating substrate 1.

Figure 11B:
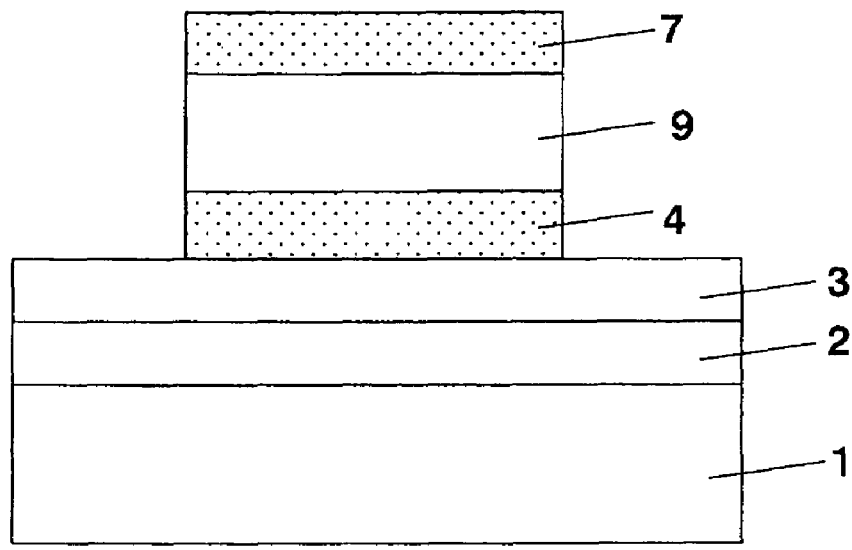

Next, as shown in FIG. 11B, the second conductor film 7', insulating film 9' and first conductor film 4' are patterned by photolithographic and anisotropic etching processes, thereby defining the upper electrode 7, dielectric portion 9 and lower electrode 4. In this patterning process, a resist pattern (not shown) that will define the shape and location of the upper electrode 7 is provided on the second conductor film 7'. But this resist pattern is removed by an oxygen plasma etching process after the patterning process is finished.

Figure 11C:
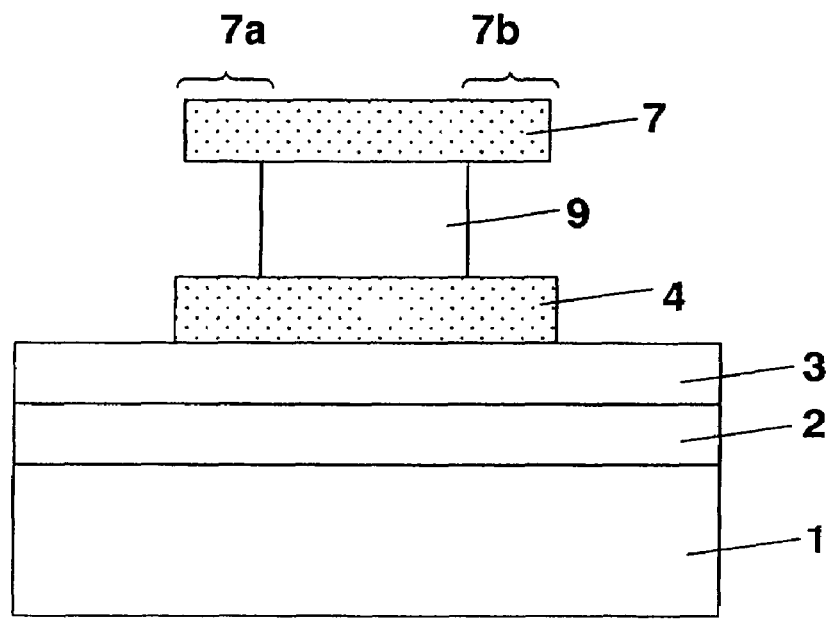

Next, as shown in FIG. 11C, the dielectric portion 9 is side-etched by a wet etching process, thereby defining the overhanging portions 7a and 7b of the upper electrode 7. By selecting an appropriate chemical agent for the wet etching process and a proper material for the insulating film 9', the transparent conductive film 3 may be hardly etched during this patterning process. More specifically, the etch rate of the transparent conductive film 3 is preferably at most one-tenth of the etch rate of the lower electrode 4'.

Figure 11D:
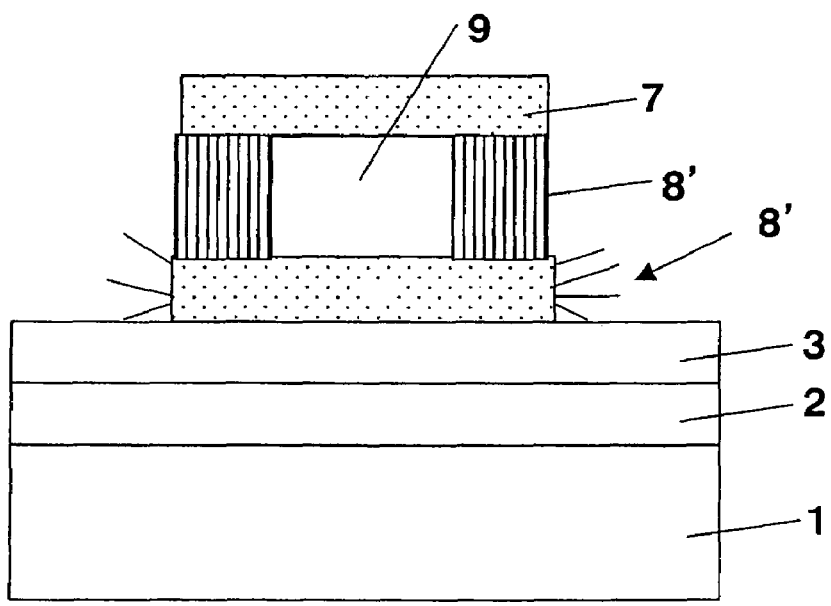

Subsequently, as shown in FIG. 11D, the nanowires 8' are grown as in the first preferred embodiment described above. In this preferred embodiment, however, the nanowires are selectively grown on the surface of the lower electrode 4 that has been patterned so as to have almost the same shape as the upper electrode 7. Accordingly, substantially no nanowires 8' grow on the transparent conductive film 3. There are some nanowires 8' growing laterally from the side surfaces of the lower electrode 4 as shown in FIG. 11D. However, since the size of the side surfaces (i.e., the thickness) of the lower electrode 4 is about 50 nm to about 200 nm, a relatively small number of nanowires 8' would grow on the side surfaces of the lower electrode 4. In addition, these unnecessary nanowires are not covered with the upper electrode 7, and therefore, can be easily removed when etched anisotropically using the upper electrode 7 as a mask. By etching away those excessive nanowires in this manner, the structure shown in FIG. 10 can be obtained. Thereafter, the same manufacturing process steps as the counterparts of the first preferred embodiment described above are carried out, thereby obtaining a vertical field effect transistor as a final product.

The catalyst for growing the nanowires 8' may be put on the upper surface of the first conductor film 4' after the first conductor film 4' to be the lower electrode 4 has been deposited. Then, the catalyst will be present on the upper surface of the patterned lower electrode 4 but hardly present on the side surfaces thereof as shown in FIG. 11C. Consequently, the nanowires 8' selectively grow on the upper surface of the lower electrode 4 but hardly grow on the side surfaces of the lower electrode 4. Accordingly, the special kind of etching process that has been described with reference to FIG. 1B is no longer needed.

In the manufacturing process of this preferred embodiment, the lower electrode 4 can be defined so as to be self-aligned with the upper electrode 7. Thus, there is no need to separately prepare a photomask for the lower electrode 4 and no mask alignment process step needs to be carried out for such a photomask, either.

Embodiment 3

Hereinafter, a configuration for a vertical field effect transistor according to still another preferred embodiment of the present invention will be described with reference to FIGS. 12A and 12B.

Figure 12A:
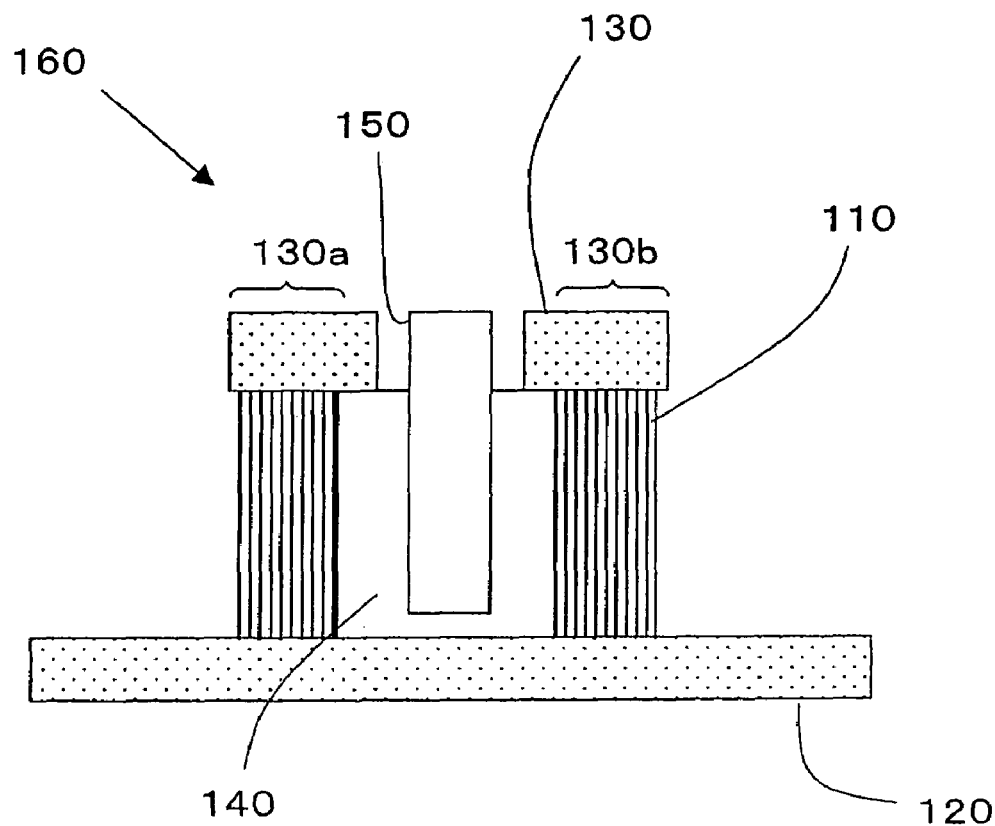
FIG. 12A is a cross-sectional view schematically illustrating a configuration for a vertical thin-film transistor according to a third specific preferred embodiment of the present invention.
Figure 12B:
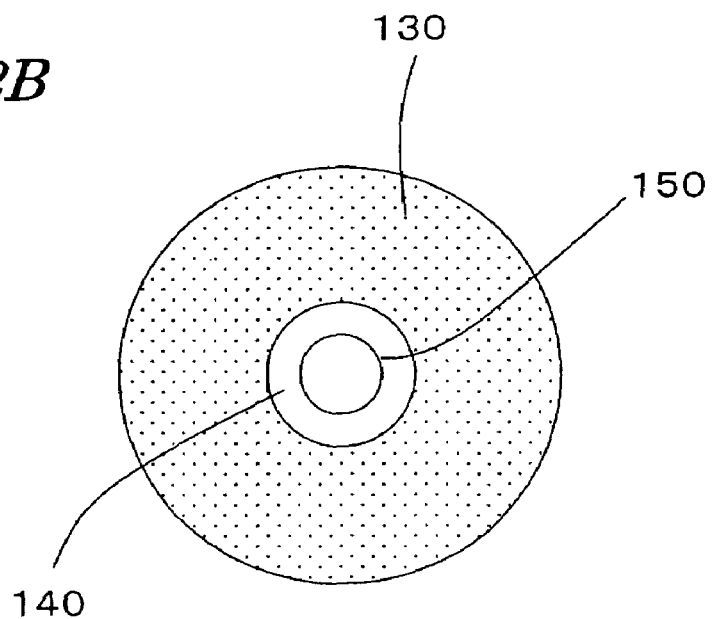
FIG. 12B is a top view thereof.

Unlike the vertical field effect transistor 100 shown in FIG. 1, the vertical field effect transistor 160 shown in FIG. 12A includes a cylindrical gate electrode 150 that extends vertically through the center of the dielectric portion 140. In the other respects, the transistors 160 and 100 have the same configuration.

As in the upper electrode 130 shown in FIG. 1, the upper electrode 130 shown in FIG. 12A is also located over the lower electrode 120 with the dielectric portion 140 interposed between them and also has an overhanging portion 130a, 130b that sticks out laterally from the upper surface of the dielectric portion 140. However, the upper electrode 130 shown in FIG. 12A has an opening, which is provided at the center to connect the gate electrode 150 to a line (not shown). This opening is preferably cut through the upper electrode 130 being patterned before the nanowires 110' are grown so as to define the active region 110.

Optionally, a single vertical field effect transistor 160 may include both the gate electrode 150 shown in FIG. 12A and the gate electrode 150 shown in FIG. 1.

Hereinafter, an exemplary method for fabricating the vertical field effect transistor 160 according to this preferred embodiment will be described with reference to FIGS. 13A through 13C.

Figure 13A:
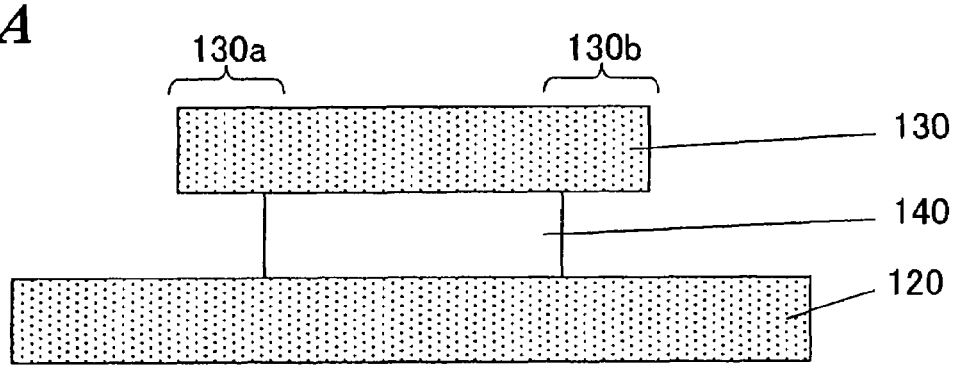
FIGS. 13A through 13C are cross-sectional views illustrating respective process steps for fabricating the vertical thin-film transistor of the third preferred embodiment shown in FIGS. 12A and 12B.

First, by the same techniques as those already described for the first and second preferred embodiments, a structure, in which the upper electrode 130 is supported by the dielectric portion 140 on the lower electrode 120, is formed as shown in FIG. 13A.

Figure 13B:
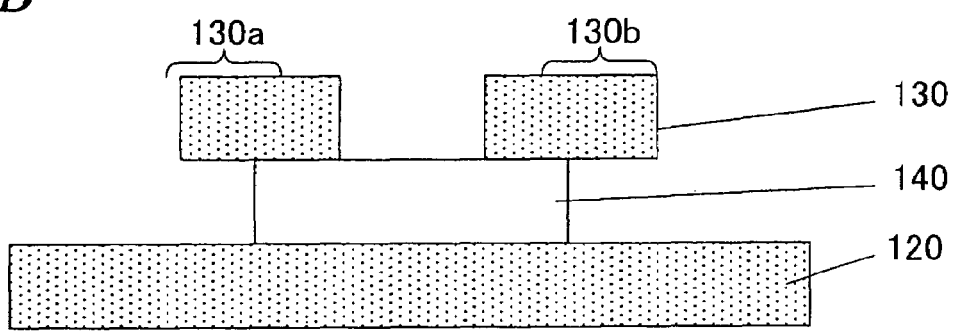

Next, as shown in FIG. 13B, the center portion of the upper electrode 130 is etched away, thereby making a first cylindrical opening through the center of the upper electrode 130. This opening may be formed by performing known photolithographic and anisotropic etching processes, for example. Before the etching process is carried out, a resist pattern (not shown) that defines the location and shape of the opening is formed on the upper electrode 130. However, this resist pattern is removed by performing an oxygen plasma etching process after the etching process is finished.

Figure 13C:
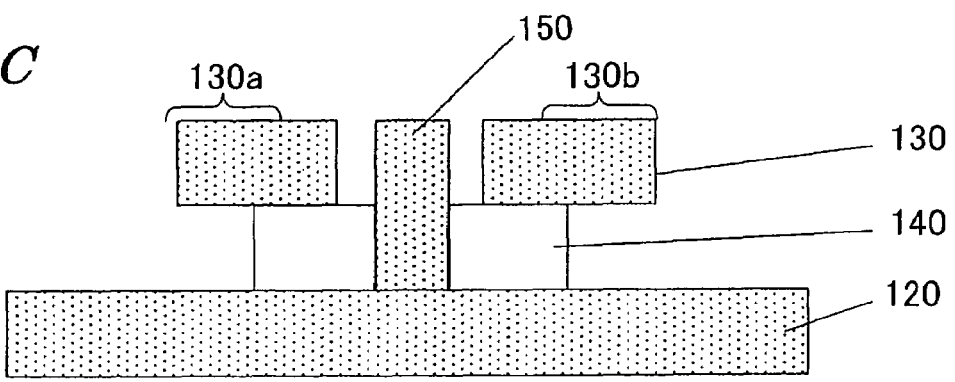

Subsequently, as shown in FIG. 13C, a gate electrode is formed so as to extend through the center of the dielectric portion 140. Specifically, the center portion of the dielectric portion 140 is etched away anisotropically by photolithographic and etching processes, thereby making a second cylindrical opening through the center of the dielectric portion 140. The second opening preferably has a diameter that is about 200 nm to about 400 nm smaller than that of the first opening that has been cut through the center portion of the upper electrode 130.

Thereafter, a cylindrical gate electrode 150 may be formed by a liftoff process, for example, so as to extend through the first and second openings.

After the process step shown in FIG. 13C has been performed, the nanowires 110' are grown in a desired area by the same method as that adopted in the preferred embodiments described above, thereby completing the transistor shown in FIG. 12.

Embodiment 4

Hereinafter, a vertical field effect transistor according to a fourth specific preferred embodiment of the present invention will be described with reference to FIGS. 14A and 14B.

Figure 14A:
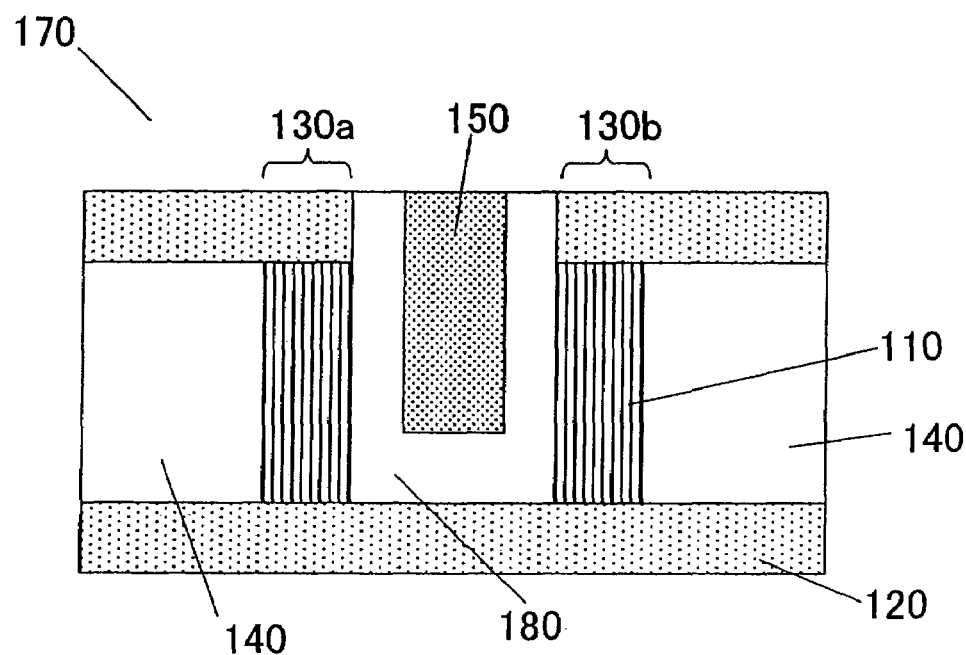
FIG. 14A is a cross-sectional view schematically illustrating a configuration for a vertical thin-film transistor according to a fourth specific preferred embodiment of the present invention.
Figure 14B:
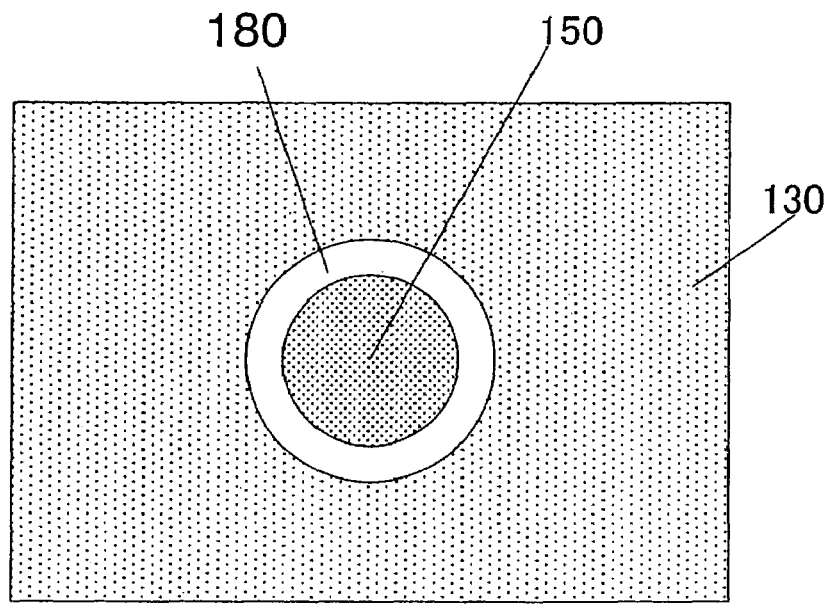
FIG. 14B is a top view thereof.

Although the dielectric portion 140 functions as a gate insulating film in the transistor 160 shown in FIG. 12A, the transistor 170 of the fourth preferred embodiment shown in FIG. 14A includes a gate insulating film 180 separately from the dielectric portion 140. In the other respects, the transistors 170 and 160 have substantially the same configuration.

As shown in FIG. 14A, the upper electrode 130 of this preferred embodiment is also located over the lower electrode 120 with the dielectric portion 140 interposed between them and also has an overhanging portion 130a, 130b that sticks out laterally from the upper surface of the dielectric portion 140. Furthermore, as shown in FIG. 14B, the upper electrode 130 covers the upper surface of the dielectric portion 140 that expands outside of the active region 110.

Hereinafter, a method for fabricating the vertical field effect transistor 170 according to this preferred embodiment will be described with reference to FIGS. 15A through 15C.

Figure 15A:
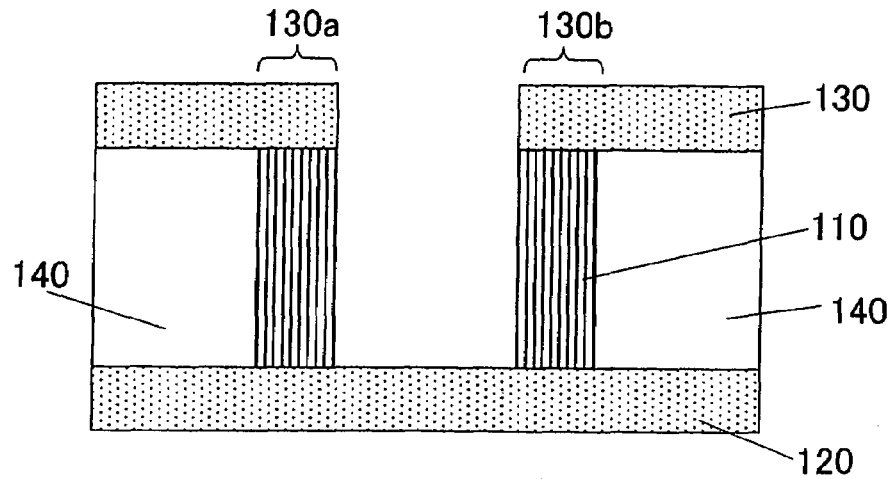
FIGS. 15A through 15C are cross-sectional views illustrating respective process steps for fabricating the vertical thin-film transistor of the fourth preferred embodiment shown in FIGS. 14A and 14B.

First, by the same techniques as those already described for the first through third preferred embodiments, a structure in which the upper electrode 130 is supported by the dielectric portion 140 on the lower electrode 120 is formed as shown in FIG. 15A. In this preferred embodiment, however, this structure has been formed so as to have a single insulating layer pattern with a plurality of cylindrical openings.

Figure 15B:
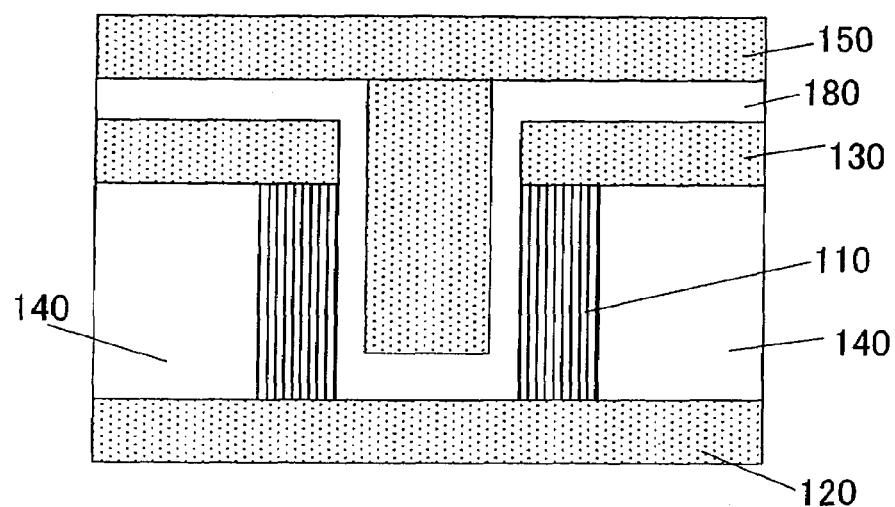

Next, as shown in FIG. 15B, two films to be the gate insulating film 180 and the gate electrode 150 are deposited in this order so as to fill the inside of the cylindrical opening. These films may be deposited by an evaporation process, a sputtering process, a CVD process or any of various other thin film deposition techniques.

Figure 15C:
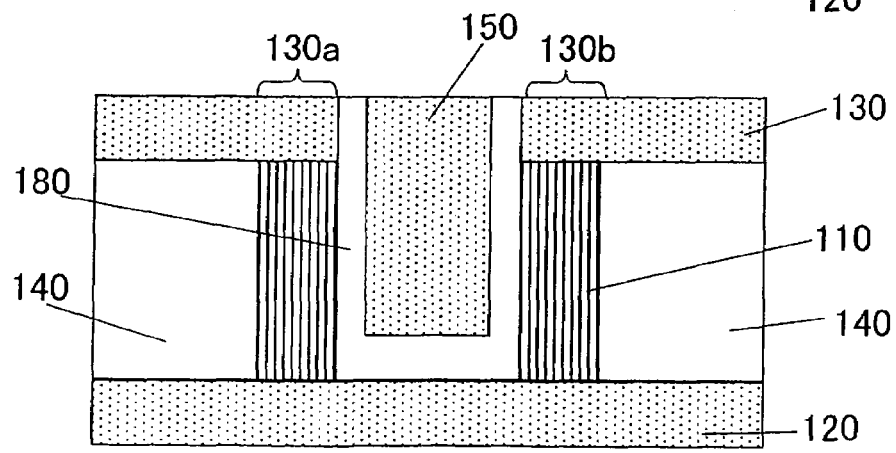

Thereafter, as shown in FIG. 15C, the excessive portions of the gate electrode 150 and gate insulating film 180, which are present on the upper electrode 130, are removed and planarized by an etch back technique or a polishing process, thereby patterning the gate electrode 150 and gate insulating film 180 into their intended shapes.

In any of the preferred embodiments described above, the nanowires are grown by the VLS method. Accordingly, their growth temperature can be lower than that of low-temperature polysilicon. As a result, thin-film transistors can be fabricated without using an expensive substrate with high thermal resistance. Also, if the growth temperature of the nanowires could be further decreased, then the nanowires could be formed even on a low-melting substrate such as a plastic substrate. In that case, a driver circuit for a flexible display or an organic EL display would be realized using those nanowires.

It should be noted that the nanowires grown by the VLS method have a single crystalline structure. Thus, a transistor with such nanowires is expected to achieve a high mobility. Consequently, a driver circuit that needs to operate sufficiently quickly, and eventually a high-performance system on display, are realizable by using those nanowires.

According to various preferred embodiments of the present invention described above, an active region can be made of a bundle of nanowires in any region required so as to be self-aligned with the upper electrode. Also, the channel length can be controlled without depending on the precision of the photolithographic process adopted. Thus, a very small channel length, which would be hard to achieve by a normal photolithographic process, is achieved as well. Furthermore, since the transistor has a vertical structure, the dimensions of each transistor can be reduced and a far greater number of transistors can be integrated together per unit area.

In the preferred embodiments described above, the transistor is supposed to use nanowires as its linear structures. Alternatively, the transistor may use CNTs instead of the nanowires.

A vertical field effect transistor according to any of various preferred embodiments of the present invention described above has a channel with such high mobility as to be effectively applicable for use in a logic IC for a system LSI, for example. In addition, the nanowires can be grown at a relatively low temperature. Accordingly, by growing the nanowires on either a glass substrate or a plastic substrate, a system on display or a sheet display can be fabricated.

While the present invention has been described with respect to preferred embodiments thereof, it will be apparent to those skilled in the art that the disclosed invention may be modified in numberous ways and may assume many embodiments other than those specifically described above. Accordingly, it is intended by the appended claims to cover all modifications of the invention that fall within the true spirit and scope of the invention.

What is claimed is:

1. A vertical field effect transistor comprising:
   a bundle of multiple linear structures, which functions as a channel region where electric carriers are transported;
   a lower electrode, which is connected to the bottom of the bundle of multiple linear structures and which functions as one of source and drain regions;
   an upper electrode, which is connected to the top of the bundle of multiple linear structures and which functions as the other of the source and drain regions;
   a gate electrode for controlling the electric conductivity of at least a portion of the bundle of multiple linear structures; and
   a gate insulating film, which is arranged between the bundle of multiple linear structures and the gate electrode in order to electrically isolate the gate electrode from the bundle of multiple linear structures,
   wherein the transistor further includes a dielectric layer which supports the upper electrode, the dielectric layer having an outer peripheral side surface,
   wherein the upper electrode is located over the lower electrode with the dielectric layer interposed between the upper and lower electrodes, and includes an overhanging end portion that sticks out laterally from over the dielectric layer,
   wherein the bundle of multiple linear structures is located right under the overhanging end portion of the upper electrode and outside of the outer peripheral side surface of the dielectric layer, and
   wherein the bundle of multiple linear structures is in contact with the overhanging end portion of the upper electrode, and the dielectric layer is not in contact with the overhanging end portion of the upper electrode.

2. The vertical field effect transistor of claim 1, wherein each said linear structure in the bundle is made of a columnar semiconductor that has grown on the lower electrode.

3. The vertical field effect transistor of claim 2, wherein the columnar semiconductor has a single crystal structure.

4. The vertical field effect transistor of claim 1, wherein an outer side surface of the bundle of multiple linear structures is aligned with a side surface of the upper electrode.

5. The vertical field effect transistor of claim 1, wherein the dielectric layer is made of an electrical insulator that supports the upper electrode, and
a lower surface of the upper electrode is in contact with either the dielectric layer or the bundle of multiple liner structures.

6. The vertical field effect transistor of claim 2, wherein the columnar semiconductor includes at least one element selected from the group consisting of silicon, germanium and carbon.

7. The vertical field effect transistor of claim 2, wherein the columnar semiconductor includes a dopant that defines its conductivity type.

8. The vertical field effect transistor of claim 1, further comprising a semiconductor substrate or an SOI substrate to support the lower electrode thereon.

9. An electronic device comprising
a substrate and
a plurality of field effect transistors provided on the substrate,
wherein at least one of the plurality of field effect transistors is a vertical field effect transistor including:
a bundle of multiple linear structures, which functions as a channel region where electric carriers are transported;
a lower electrode, which is connected to the bottom of the bundle of multiple linear structures and which functions as one of source arid drain regions;
an upper electrode, which is connected to the top of the bundle of multiple linear structures and which functions as the other of the source and drain regions;
a gate electrode for controlling the electric conductivity of at least a portion of the bundle of multiple linear structures; and
a gate insulating film, which is arranged between the bundle of multiple linear structures and the gate electrode in order to electrically isolate the gate electrode from the bundle of multiple linear structures wherein:
the transistor further includes a dielectric layer which supports the upper electrodes, the dielectric layer having an outer peripheral side surface,
the upper electrode is located over the lower electrode with the dielectric layer interposed between the upper and lower electrodes, and includes an overhanging end portion that sticks out laterally from over the dielectric layer,
the bundle of multiple linear structures is located right under the overhanging end portion of the upper electrode and outside of the outer peripheral side surface of the dielectric layer, and
the bundle of multiple linear structures is in contact with the overhanging end portion of the upper electrode, and the dielectric layer is not in contact with the overhanging end portion of the upper electrode.

10. The electronic device of claim 9, wherein the plurality of field effect transistors together make up a CMOS circuit.

11. The electronic device of claim 9, wherein the electronic device functions as a large scale integrated circuit.

12. The electronic device of claim 9, wherein the substrate is a glass substrate or a plastic substrate.

13. The electronic device of claim 9, wherein the plurality of field effect transistors are arranged in matrix on the substrate such that each field effect transistor is associated with a pixel, and the electronic device functions as a display device.

14. A method for fabricating a vertical field effect transistor, the transistor including: a bundle of multiple linear structures, which functions as a channel region where electric carriers are transported; a lower electrode, which is connected to the bottom of the bundle of multiple linear structures and which functions as one of source and drain regions; an upper electrode, which is connected to the top of the bundle of multiple linear structures and which functions as the other of the source and drain regions; a gate electrode for controlling electric conductivity of at least a portion of the bundle of multiple linear structures; and a gate insulating film, which is arranged between the bundle of multiple linear structures and the gate electrode in order to electrically isolate the gate electrode from the bundle of multiple linear structures,
the method comprising the steps of:
(A) farming a structure in which a dielectric layer supports the upper electrode, the dielectric layer having an outer peripheral side surface, and in which the upper electrode has an overhanging end portion that sticks out laterally from over the dielectric layer; and
(B) growing the bundle of multiple linear structures so that the multiple linear structures extend from an area on an upper surface of the lower electrode, which is not covered with the dielectric layer, toward a lower surface of the overhanging end portion of the upper electrode, wherein:
the bundle of multiple linear structures is in contact with the overhanging end portion of the upper electrode, and the dielectric layer is not in contact with the overhanging end portion of the upper electrode, and
the bundle of multiple linear structures is located outside of the outer peripheral side surface of the dielectric layer.

15. The method of claim 14, wherein the step (A) includes the steps of:
(a1) forming a structure in which the dielectric layer is interposed between the upper and lower electrodes; and
(a2) side etching and setting back at least a part of the dielectric layer inward from its side surface.

16. The method of claim 15, wherein the step (a2) includes the step of etching away a part of the dielectric layer by a wet etching process.

17. The method of claim 15, wherein the step (a1) includes the steps of:
providing a first conductor film to be the lower electrode;
depositing an insulating film on the first conductor film;
stacking a second conductor film to be the upper electrode on the insulating film;
providing a masking layer, which defines the location and shape of the upper electrode, on the second conductor film;
etching away exposed portions of the second conductor film, which arc not covered with the masking layer, thereby forming the upper electrode out of the second conductor film;
selectively etching the insulating film so as to form the dielectric layer; and
patterning the first conductor film, thereby forming the lower electrode out of the first conductor film.

18. The method of claim 15, wherein the step (a1) includes the steps of
providing a first conductor film to be the lower electrode;
depositing an insulating film on the first conductor film;
stacking a second conductor film to be the upper electrode on the insulating film;

providing a masking layer, which defines the location and shape of the upper electrode, on the second conductor film;

etching away exposed portions of the second conductor film, which are not covered with the masking layer, thereby forming the upper electrode out of the second conductor film; and selectively etching the insulating film with the upper electrode used as a mask, thereby defining the dielectric layer.

19. The method of claim 17, wherein the step of depositing the insulating film includes the step of depositing a silicon dioxide film or a silicon nitride film.

20. The method of claim 14, further comprising the step (C) of selectively removing some of the multiple liner structures, which are not covered with the upper electrode, by etching the multiple linear structures anisotropically with the upper electrode used as a mask.

21. The method of claim 14, wherein the step (B) includes the step of growing the multiple linear structures by a CVD process.

22. The method of claim 21, wherein the step (A) includes the step of putting a catalyst for growing the multiple linear structures on the first conductor film deposited.

23. The method of claim 14, wherein the step (A) includes the step of puffing a catalyst for growing the multiple liner structures on the insulating film deposited.

24. The vertical field effect transistor of claim 1, wherein the bundle of multiple linear structures is located between the dielectric layer and the gate electrode.

25. The vertical field effect transistor of claim 24, wherein the dielectric layer has an opening provided at a center of the dielectric layer, and the gate electrode is provided to extend through the opening of the dielectric layer.

26. A vertical field effect transistor comprising:
a bundle of multiple linear structures, which functions as a channel region where electric carriers are transported;
a lower electrode, which is connected to the bottom of the bundle of multiple linear structures and which functions as one of source and drain regions;
an upper electrode, which is connected to the top of the bundle of multiple linear structures and which functions as the other of the source and drain regions;
a gate electrode for controlling the electric conductivity of at least a portion of the bundle of multiple linear structures; and
a gate insulating film, which is arranged between the bundle of multiple linear structures and the gate electrode in order to electrically isolate the gate electrode from the bundle of multiple linear structures, wherein:
the transistor further includes a dielectric layer which supports the upper electrode, and which has an opening,
the upper electrode is located over the lower electrode with the dielectric layer interposed between the upper and lower electrodes, and includes an overhanging end portion that sticks out laterally from over the dielectric layer to a center of the opening of the dielectric layer,
the bundle of multiple linear structures is located right under the overhanging end portion of the upper electrode and inside the opening, and
the bundle of multiple linear structures is in contact with the overhanging end portion of the upper electrode, and the dielectric layer is not in contact with the overhanging end portion of the upper electrode.

27. The vertical field effect transistor of claim 1, wherein the gate electrode is separated from the dielectric layer by the bundle of multiple linear structures.

* * * * *

UNITED STATES PATENT AND TRADEMARK OFFICE
CERTIFICATE OF CORRECTION

| | | |
|---|---|---|
| PATENT NO. | : 7,586,130 B2 | Page 1 of 1 |
| APPLICATION NO. | : 11/344574 | |
| DATED | : September 8, 2009 | |
| INVENTOR(S) | : Takahiro Kawashima et al. | |

It is certified that error appears in the above-identified patent and that said Letters Patent is hereby corrected as shown below:

Title Page; In Item "(56) References Cited", under "FOREIGN PATENT DOCUMENTS", the reference "EP     0452 950     10/1991" is listed a second time as "EP 0452950 A2 * 10/1991". Please delete the first occurrence.

In the Claims,

Column 17, Line 32 (Claim 9), change "source arid drain" to --source and drain--;

Column 18, Line 18 (Claim 14), change "(A) farming a structure" to --(A) forming a structure--;

Column 18, Line 63 (Claim 18), change "the steps of" to --the steps of:--;

Column 19, Line 26 (Claim 23), change "of puffing a catalyst" to --of putting a catalyst--; and Column 19, Line 26 (Claim 23), change "multiple liner" to --multiple linear--.

Signed and Sealed this

Eleventh Day of May, 2010

David J. Kappos
*Director of the United States Patent and Trademark Office*